US008294800B2

(12) United States Patent
Harada et al.

(10) Patent No.: US 8,294,800 B2
(45) Date of Patent: Oct. 23, 2012

(54) SOLID-STATE IMAGING DEVICE AND READOUT METHOD THEREOF

(75) Inventors: Kouichi Harada, Kanagawa (JP); Hiroki Hagiwara, Tokyo (JP); Yusuke Kikuchi, Kanagawa (JP); Keita Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 373 days.

(21) Appl. No.: 12/588,521

(22) Filed: Oct. 19, 2009

(65) Prior Publication Data

US 2010/0123813 A1  May 20, 2010

(30) Foreign Application Priority Data

Nov. 19, 2008 (JP) .................... 2008-295194

(51) Int. Cl.
H04N 3/14 (2006.01)
(52) U.S. Cl. ....................................... 348/311
(58) Field of Classification Search .......... 348/297–299, 348/311–324
See application file for complete search history.

(56) References Cited

U.S. PATENT DOCUMENTS

| | | | | |
|---|---|---|---|---|
| 6,974,975 B2 * | 12/2005 | Shizukuishi | .................... | 257/98 |
| 7,420,607 B2 * | 9/2008 | Ota et al. | ..................... | 348/315 |
| 2004/0201760 A1 * | 10/2004 | Ota et al. | ....................... | 348/272 |
| 2006/0197859 A1 * | 9/2006 | Oda | .............................. | 348/311 |
| 2008/0266436 A1 * | 10/2008 | Numaguchi et al. | .......... | 348/311 |
| 2009/0033784 A1 * | 2/2009 | Machida | ....................... | 348/311 |
| 2010/0045841 A1 * | 2/2010 | Otsuka et al. | ................. | 348/314 |

FOREIGN PATENT DOCUMENTS

JP  2001-060681  3/2001

\* cited by examiner

*Primary Examiner* — Chieh M Fan
*Assistant Examiner* — Dillon Durnford Geszvain
(74) *Attorney, Agent, or Firm* — Rader Fishman & Grauer, PLLC

(57) ABSTRACT

A solid-state imaging device includes: a plurality of pixels arrayed in the vertical transfer direction and in the horizontal transfer direction; a vertical CCD shift register disposed between two pixels adjacent in the horizontal transfer direction of the plurality of pixels; a first channel stop portion used for separation between pixels, formed between the two pixels adjacent in the horizontal transfer direction, and pixels adjacent to the two pixels adjacent in the horizontal transfer direction, in the horizontal transfer direction; and a readout gate portion and a second channel stop portion, formed in a direction parallel to the vertical transfer direction between the pixels and the vertical CCD shift register, with the two pixels adjacent in the horizontal transfer direction sharing the vertical CCD shift register, and with an insulating layer which is thicker than the gate insulating layer of the vertical CCD shift register being formed above the first channel stop portion.

13 Claims, 27 Drawing Sheets

SOLID-STATE IMAGING DEVICE AND READOUT METHOD THEREOF

BACKGROUND OF THE INVENTION

1. Field of the Invention

The present invention relates to a solid-state imaging device and a readout method thereof.

2. Description of the Related Art

Technology has been proposed wherein a vertical CCD shift register is shared by two pixels adjacent in the horizontal transfer direction, thereby increasing sensor aperture (e.g., see Japanese Unexamined Patent Application Publication No. 2001-60681). However, with the configuration proposed in Japanese Unexamined Patent Application Publication No. 2001-60681, readout electrodes are shared in the horizontal transfer direction, and readout voltage is applied between pixels in the vertical transfer direction, and accordingly, color mixture between pixels causes a problem.

SUMMARY OF THE INVENTION

The above configuration is problematic in that readout electrodes are shared in the horizontal transfer direction, and readout voltage is applied between pixels in the vertical transfer direction, resulting in color mixture between pixels.

It has been found to be desirable to enable color mixture between pixels to be eliminated with a charge-coupled imaging device in which two pixels adjacent in the horizontal transfer direction share a vertical CCD shift register.

According to an embodiment of the present invention, there is provided a solid-state imaging device (first solid-state imaging device) including: a plurality of pixels arrayed in the vertical transfer direction and in the horizontal transfer direction; a vertical CCD shift register disposed between two pixels adjacent in the horizontal transfer direction of the plurality of pixels; a first channel stop portion used for separation between pixels, formed between the two pixels adjacent in the horizontal transfer direction, and pixels adjacent to the two pixels adjacent in the horizontal transfer direction, in the horizontal transfer direction; and a readout gate portion and a second channel stop portion, formed in a direction parallel to the vertical transfer direction between the pixels and the vertical CCD shift register, with the two pixels adjacent in the horizontal transfer direction sharing the vertical CCD shift register, and with an insulating layer which is thicker than the gate insulating layer of the vertical CCD shift register being formed above the first channel stop portion.

With the above solid-state imaging device (first solid-state imaging device), the insulating layer formed above the first channel stop portion is formed thicker than the gate insulating layer of the vertical CCD shift register, and accordingly, even in the event that readout voltage is applied between pixels in the vertical transfer direction, in between pixels is not depleted.

According to an embodiment of the present invention, there is provided a solid-state imaging device (second solid-state imaging device) including: a plurality of pixels arrayed in the vertical transfer direction and in the horizontal transfer direction; a vertical CCD shift register disposed between two pixels adjacent in the horizontal transfer direction of the plurality of pixels; a first channel stop portion used for separation between pixels, formed between the two pixels adjacent in the horizontal transfer direction, and pixels adjacent to the two pixels adjacent in the horizontal direction, in the horizontal transfer direction; and a readout gate portion and a second channel stop portion, formed in a direction parallel to the vertical transfer direction between the pixels and the vertical CCD shift register, with the two pixels adjacent in the horizontal transfer direction sharing the vertical CCD shift register, and with the transfer electrode of the vertical CCD shift register being a transfer electrode having a 3-electrode structure per pixel, and with a portion of the one transfer electrode having a 3-electrode structure being formed above the readout gate portion in the vertical transfer direction via a readout gate insulating layer.

With the above solid-state imaging device (second solid-state imaging device), the transfer electrode of the vertical CCD shift register is a transfer electrode having a 3-electrode structure per pixel, and accordingly, readout voltage is not applied between pixels in the vertical transfer direction.

According to an embodiment of the present invention, there is provided a solid-state imaging device (third solid-state imaging device) including: a plurality of pixels arrayed in the vertical transfer direction and in the horizontal transfer direction; a vertical CCD shift register disposed between two pixels adjacent in the horizontal transfer direction of the plurality of pixels; a first channel stop portion used for separation between pixels, formed between the two pixels adjacent in the horizontal transfer direction, and pixels adjacent to the two pixels adjacent in the horizontal transfer direction, in the horizontal transfer direction; and a readout gate portion and a second channel stop portion, formed in a direction parallel to the vertical transfer direction between the pixels and the vertical CCD shift register, with the two pixels adjacent in the horizontal transfer direction sharing the vertical CCD shift register, and with a readout electrode being formed above the readout gate portion independently of the transfer electrode of the vertical CCD shift register via a readout gate insulating layer.

With the above solid-state imaging device (third solid-state imaging device), a readout electrode is formed above the readout gate portion independently of the transfer electrode of the vertical CCD shift register via a readout gate insulating layer, and accordingly, readout voltage is not applied between pixels in the vertical transfer direction.

According to an embodiment of the present invention, there is provided a readout method (first readout method) for a solid-state imaging device, the solid-state imaging device including a plurality of pixels arrayed in the vertical transfer direction and in the horizontal transfer direction, a vertical CCD shift register disposed between two pixels adjacent in the horizontal transfer direction of the plurality of pixels, and a first channel stop portion used for separation between pixels, formed between the two pixels, and pixels adjacent to the two pixels in the horizontal transfer direction, the method including the steps of: sharing the vertical CCD shift register by the two pixels disposed in the horizontal transfer direction; providing a readout wiring, disposed between the pixels in the vertical transfer direction, which connects to the readout electrode formed in the each pixel; making up the readout wiring with two wirings of a first readout wiring and a second readout wiring, disposed between pixels in the vertical transfer direction; connecting the first readout wiring and the second readout wiring alternately as to the readout electrode formed in each pixel arrayed in the horizontal transfer direction between the first readout wiring and the second readout wiring; and reading out all the pixels in two steps by executing readout of the first readout wiring, and readout of the second readout wiring alternately.

With the above readout method for a solid-state imaging device (first readout method), the first readout wiring and the second readout wiring are connected alternately as to the readout electrode of each pixel arrayed in the horizontal transfer direction between the first readout wiring and the second readout wiring, and accordingly, the readout electrodes of all the pixels are connected to the first readout wiring and the second readout wiring.

According to an embodiment of the present invention, there is provided a readout method (second readout method) for a solid-state imaging device, the solid-state imaging device including a plurality of pixels arrayed in the vertical transfer direction and in the horizontal transfer direction, a vertical CCD shift register disposed between two pixels adjacent in the horizontal transfer direction of the plurality of pixels, and a first channel stop portion used for separation between pixels, formed between the two pixels, and pixels adjacent to the two pixels in the horizontal transfer direction, the method including the steps of: sharing the vertical CCD shift register by the two pixels disposed in the horizontal transfer direction; disposing the first readout wiring and the second readout wiring alternately one wiring at a time between pixels in the vertical transfer direction; connecting the first readout wiring alternately to the readout electrodes formed in pixels across the first readout wiring in the vertical direction; connecting the second readout wiring to the readout electrodes formed in pixels to which the first readout wiring is not connected, of pixels across the second readout wiring in the vertical direction; and reading out all the pixels in two steps by executing readout of the first readout wiring, and readout of the second readout wiring alternately.

With the above readout method for a solid-state imaging device (second readout method), the first readout wiring is alternately connected to the readout electrodes formed in pixels across the first readout wiring in the vertical direction; the second readout wiring is connected to the readout electrodes formed in pixels to which the first readout wiring is not connected, of pixels across the second readout wiring in the vertical transfer direction, and accordingly, the readout electrodes of all of the pixels are connected to the first readout wiring and the second readout wiring.

The first solid-state imaging device has an advantage wherein even in the event that readout voltage is applied between pixels in the vertical transfer direction, in between pixels is not depleted, whereby occurrence of color mixture between pixels can be suppressed. Moreover, the first solid-state imaging device has an advantage wherein the two pixels adjacent in the horizontal transfer direction share the vertical CCD shift register between the two pixels thereof, whereby the sensor aperture can be increased by just that much, and accordingly, sensitivity, and the number of saturation signal electrons can be improved regardless of thinning of pixel size.

The second solid-state imaging device has an advantage wherein readout voltage is not applied between pixels in the vertical transfer direction, whereby occurrence of color mixture between pixels can be suppressed. Moreover, the second solid-state imaging device has an advantage wherein the two pixels adjacent in the horizontal transfer direction share the vertical CCD shift register between the two pixels thereof, whereby the sensor aperture can be increased by just that much and accordingly, sensitivity, and the number of saturation signal electrons can be improved regardless of thinning of pixel size.

The third solid-state imaging device has an advantage wherein readout voltage is not applied between pixels in the vertical transfer direction, whereby occurrence of color mixture between pixels can be suppressed. Moreover, the third solid-state imaging device has an advantage wherein the two pixels adjacent in the horizontal transfer direction share the vertical CCD shift register between the two pixels thereof, whereby the sensor aperture can be increased by just that much, and accordingly, sensitivity, and the number of saturation signal electrons can be improved regardless of thinning of pixel size.

With the readout method for a solid-state imaging device (first readout method), the readout electrodes of all the pixels are connected to the first readout wiring and the second readout wiring, whereby readout of the first readout wiring and readout of the second readout wiring can be executed alternately. Thus, readout voltage is not applied between the pixels in the vertical transfer direction, whereby occurrence of color mixture between pixels can be suppressed. Also, there is provided an advantage wherein all the pixels can be read out in two steps.

With the readout method for a solid-state imaging device (second readout method), the readout electrodes of all the pixels are connected to the first readout wiring and the second readout wiring, whereby readout of the first readout wiring and readout of the second readout wiring can be executed alternately. Thus, readout voltage is not applied between the pixels in the vertical transfer direction, whereby occurrence of color mixture between pixels can be suppressed. Also, there is provided an advantage wherein all the pixels can be read out in two steps.

Figure 9:
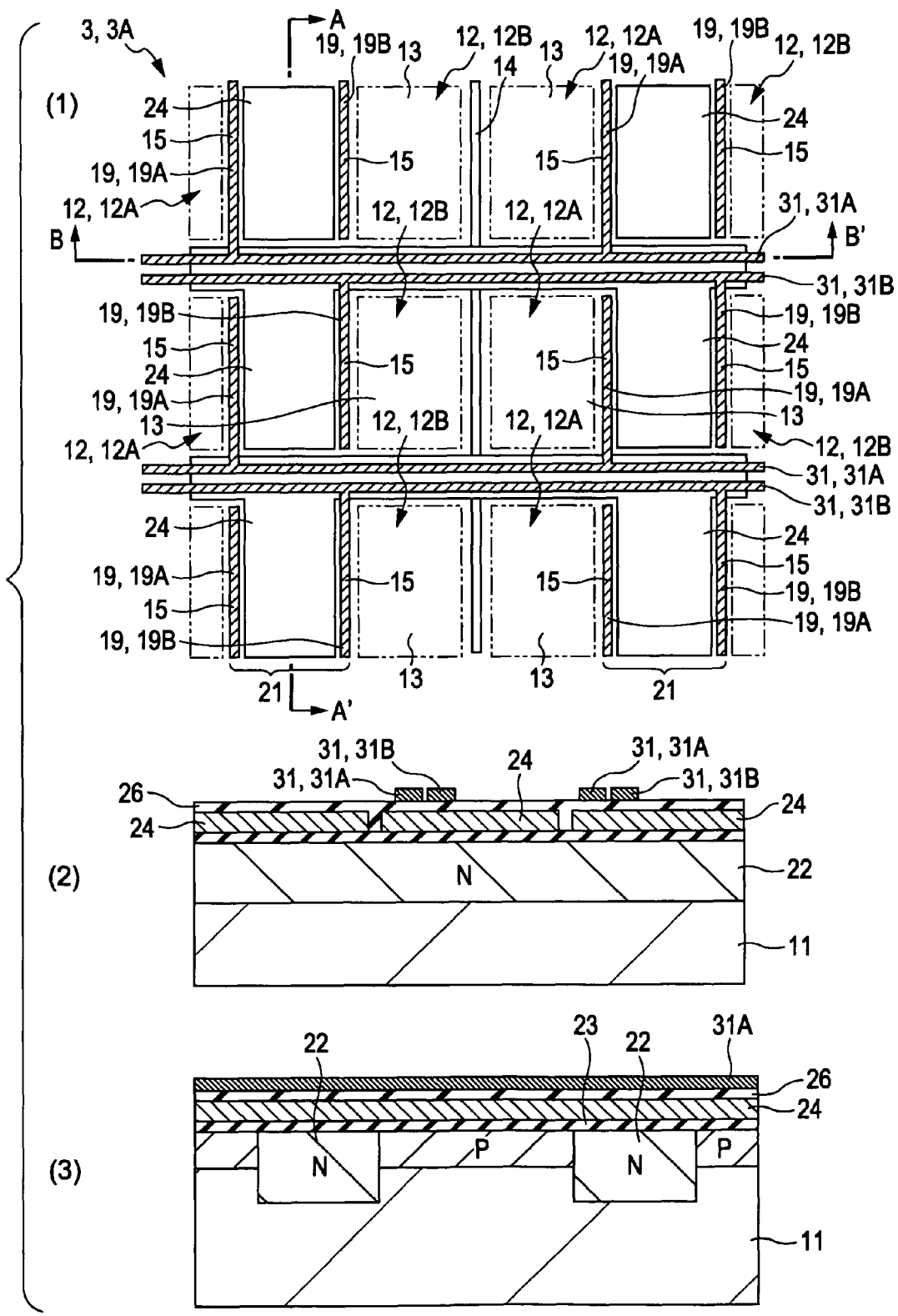
Figure 10:
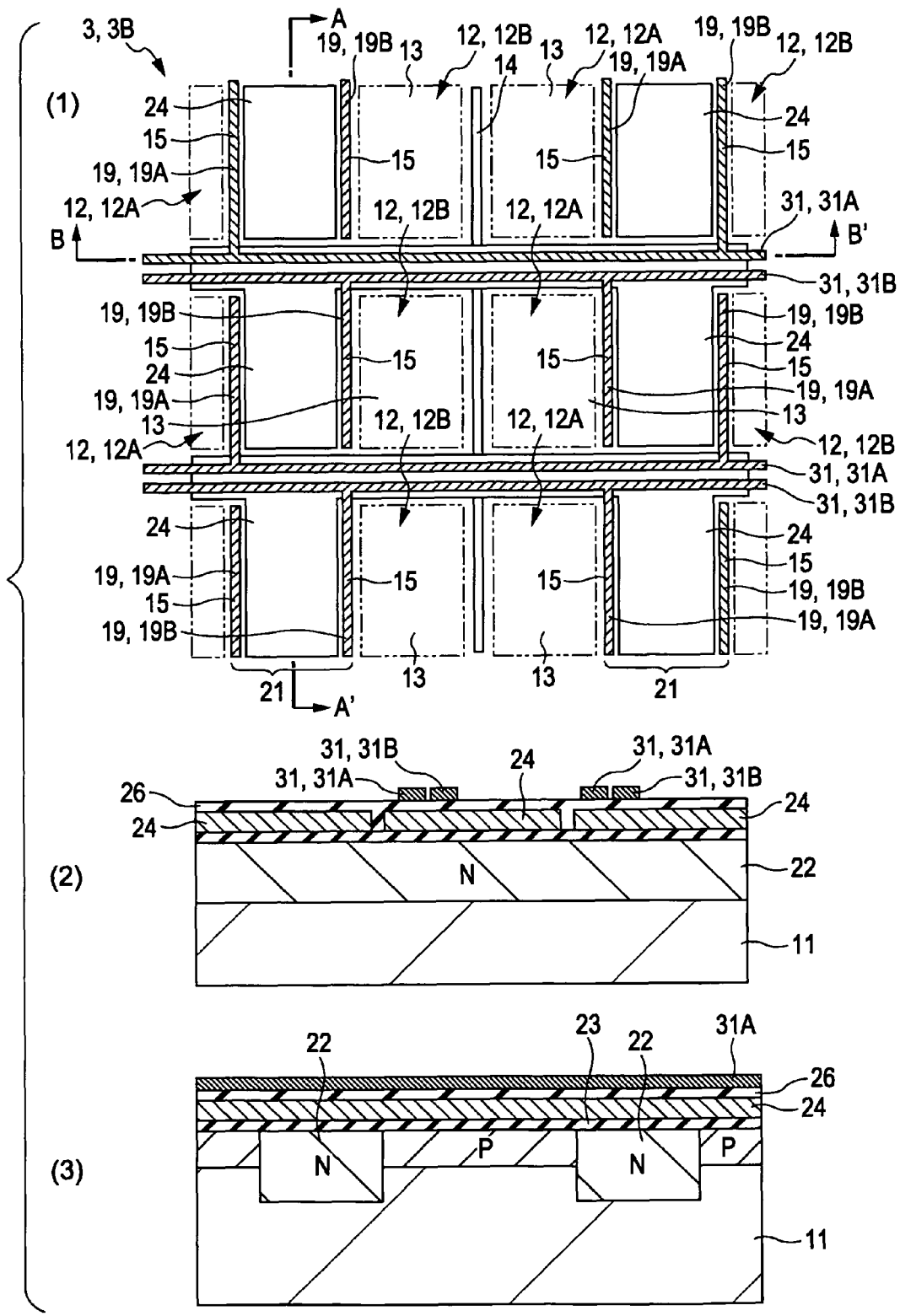
Figure 11:
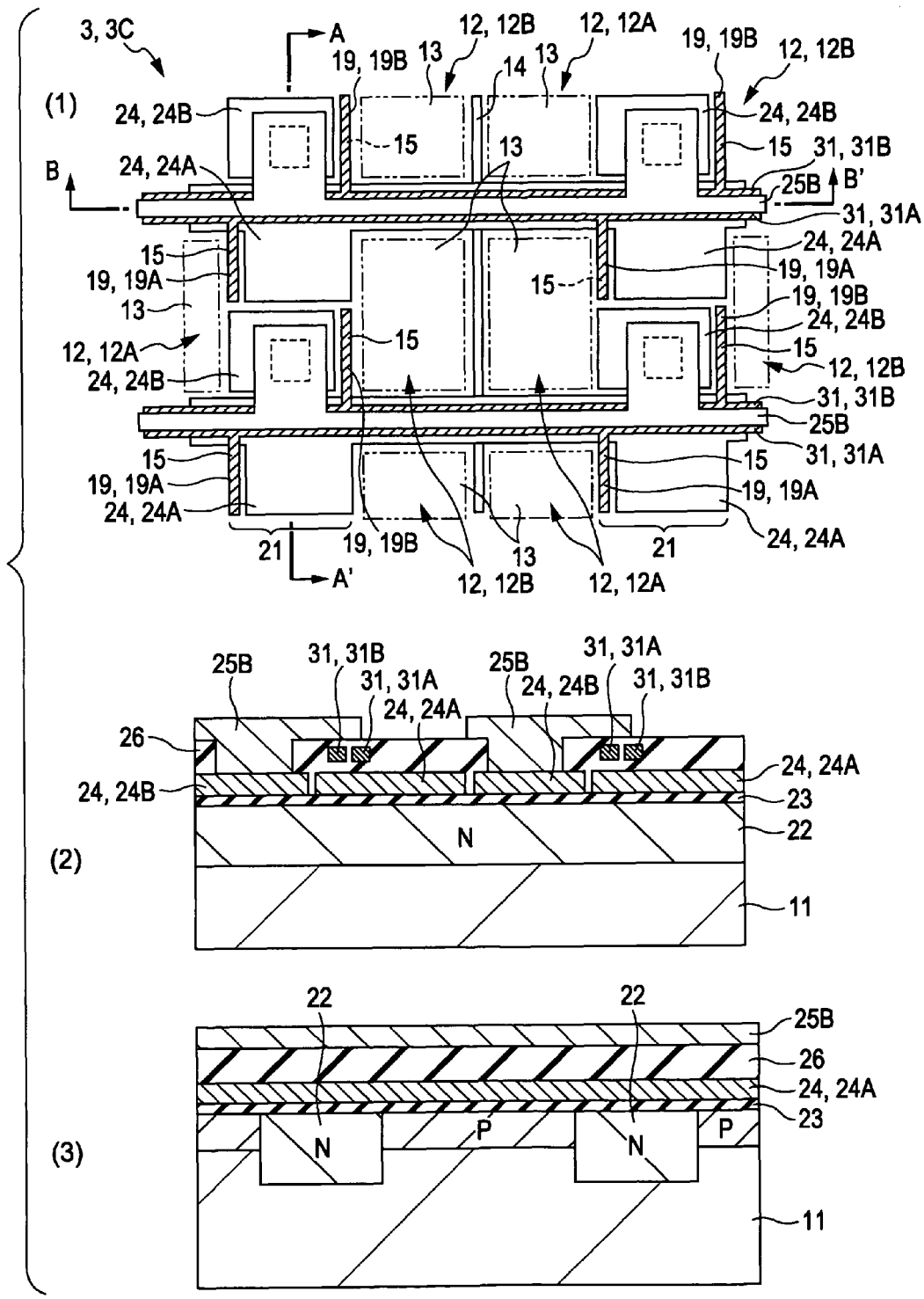
Figure 12:
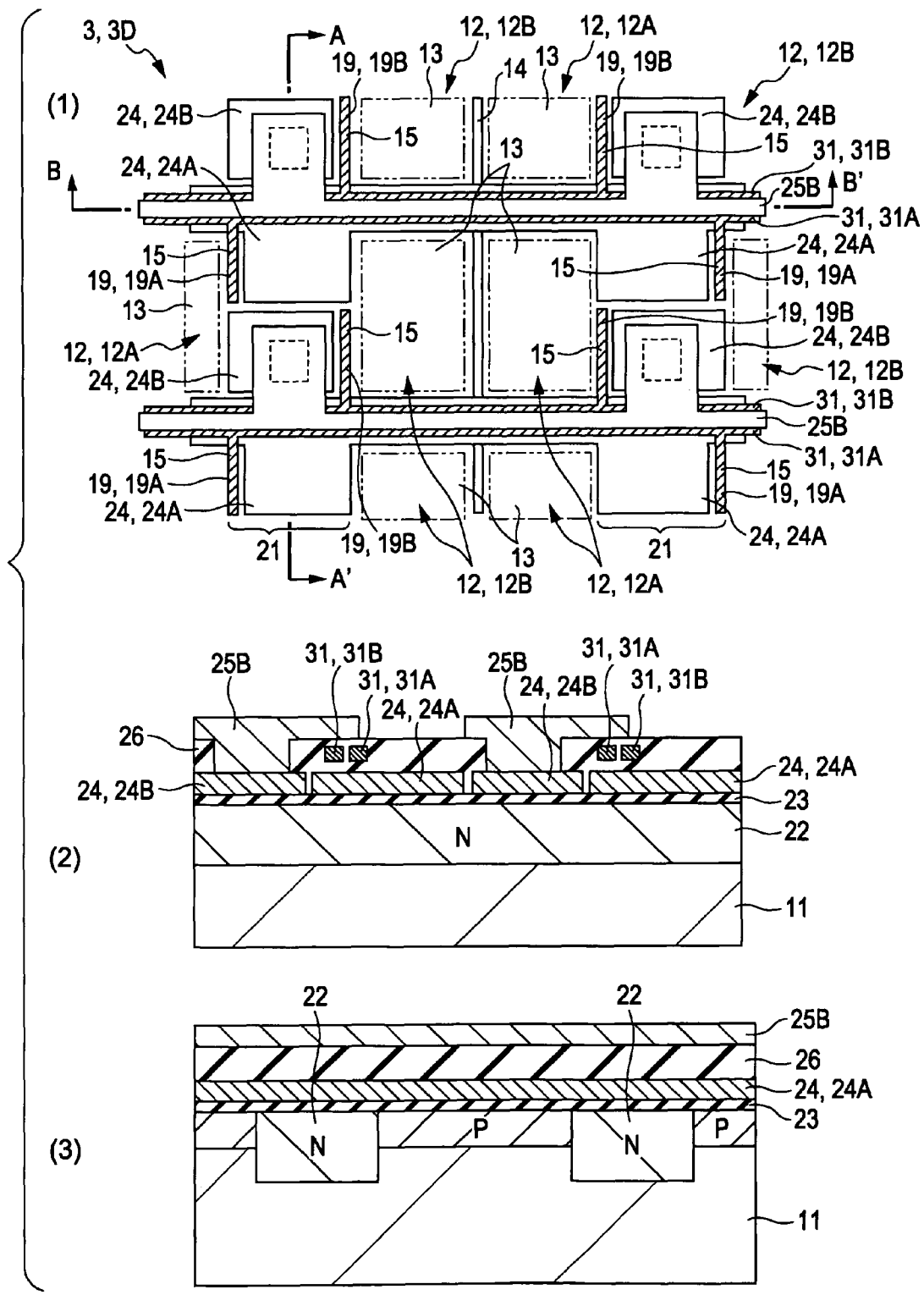
Figure 13:
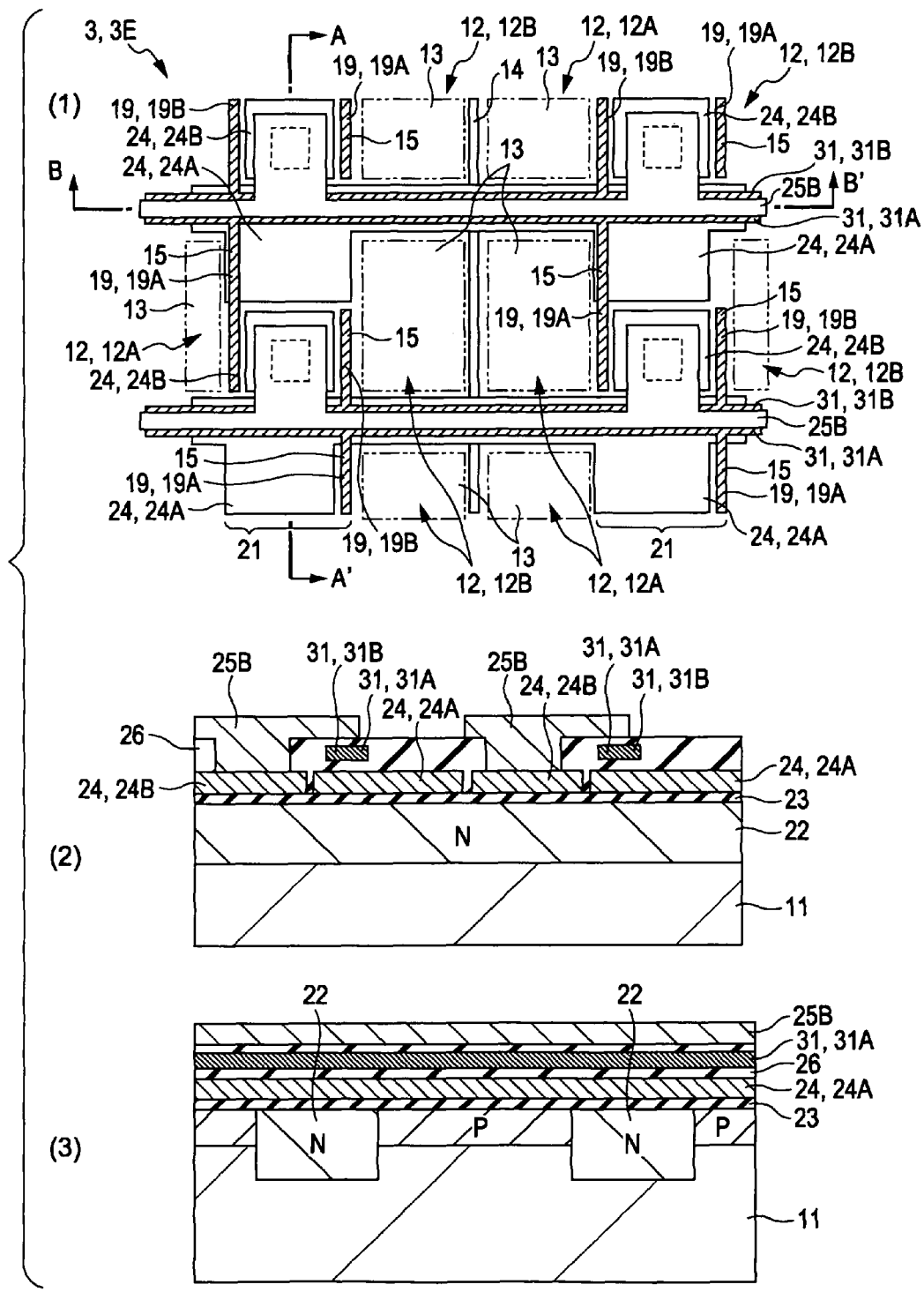
Figure 14:
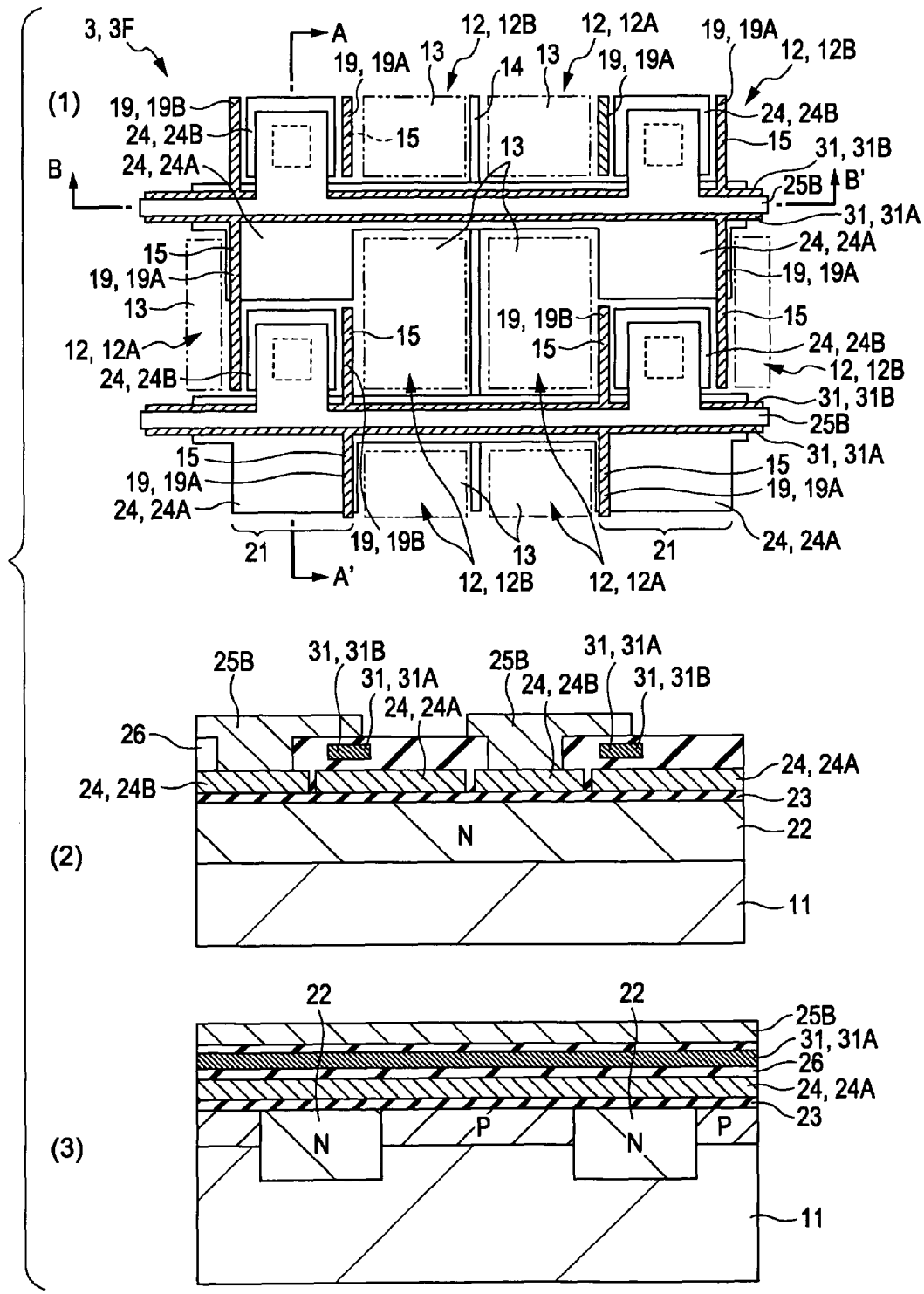
Figure 15:
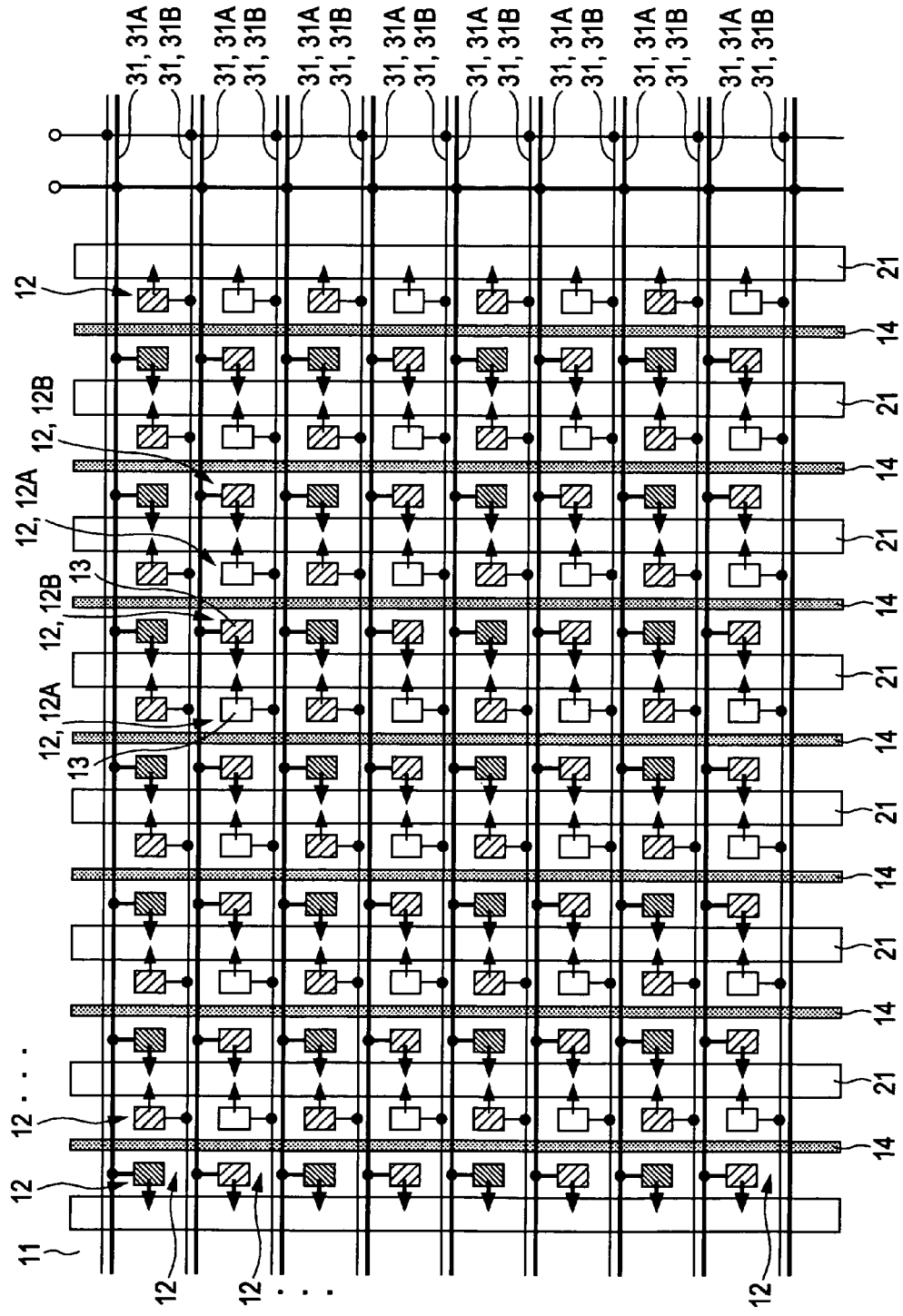
Figure 16:
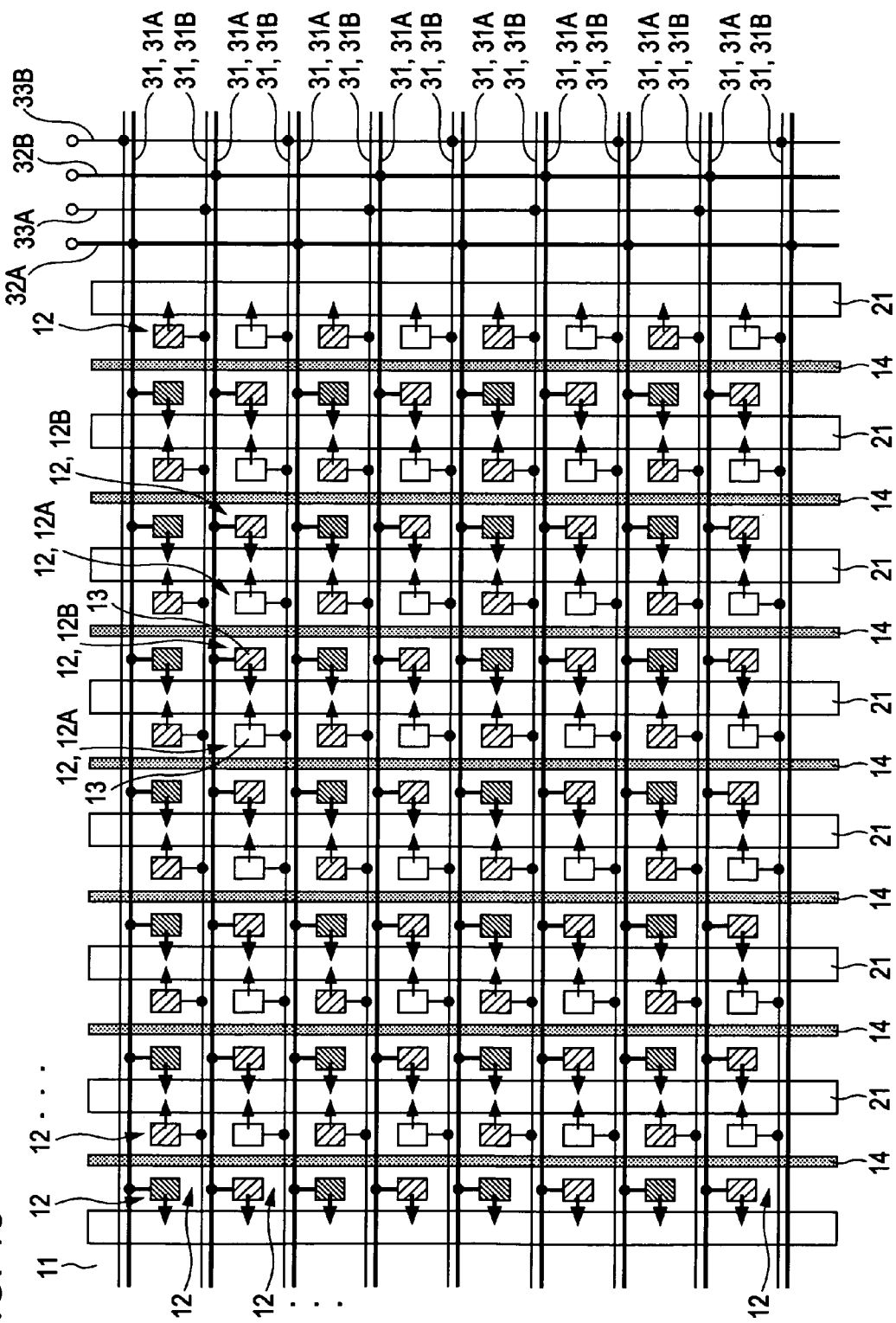
Figure 17:
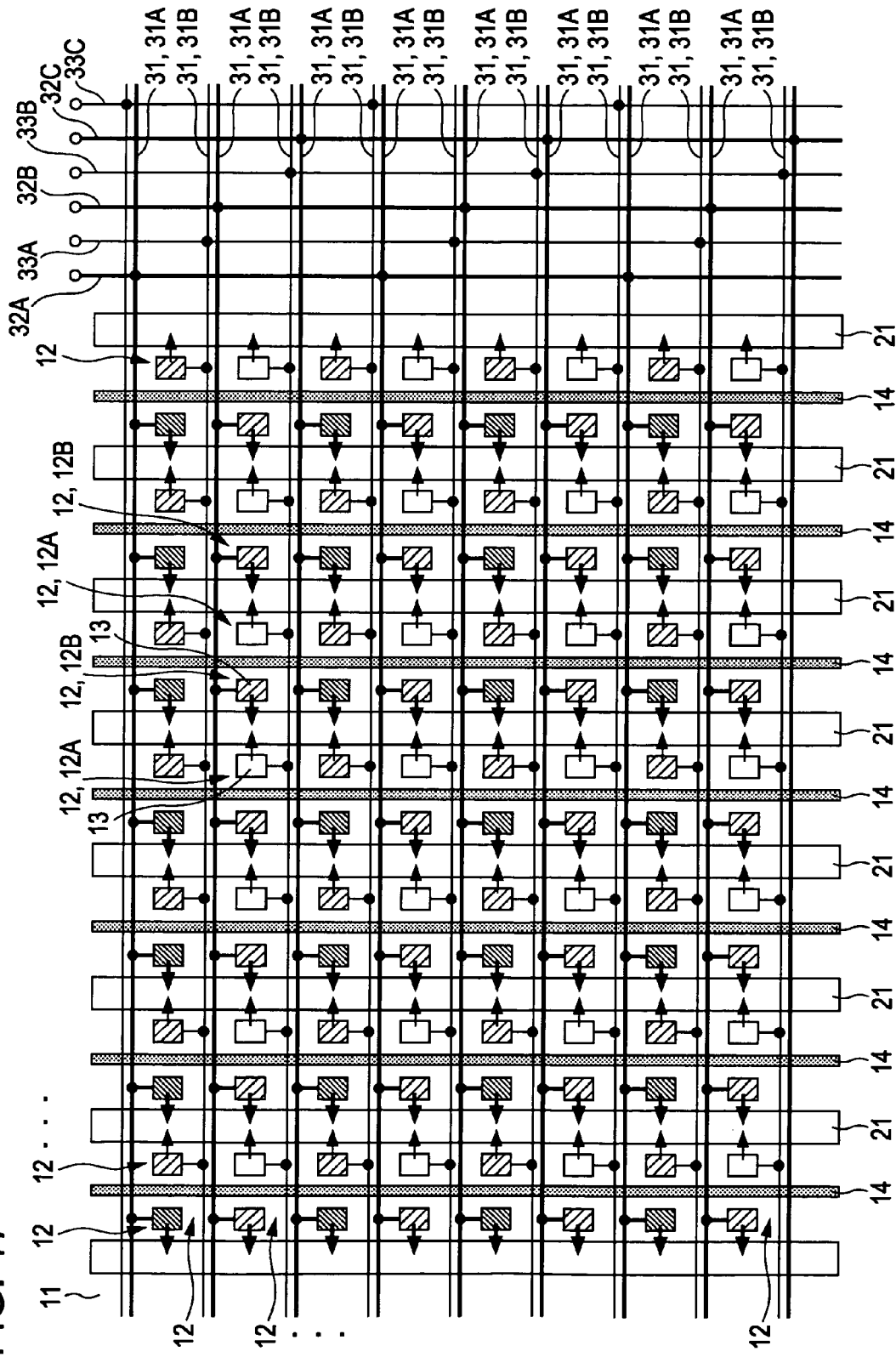
Figure 18:
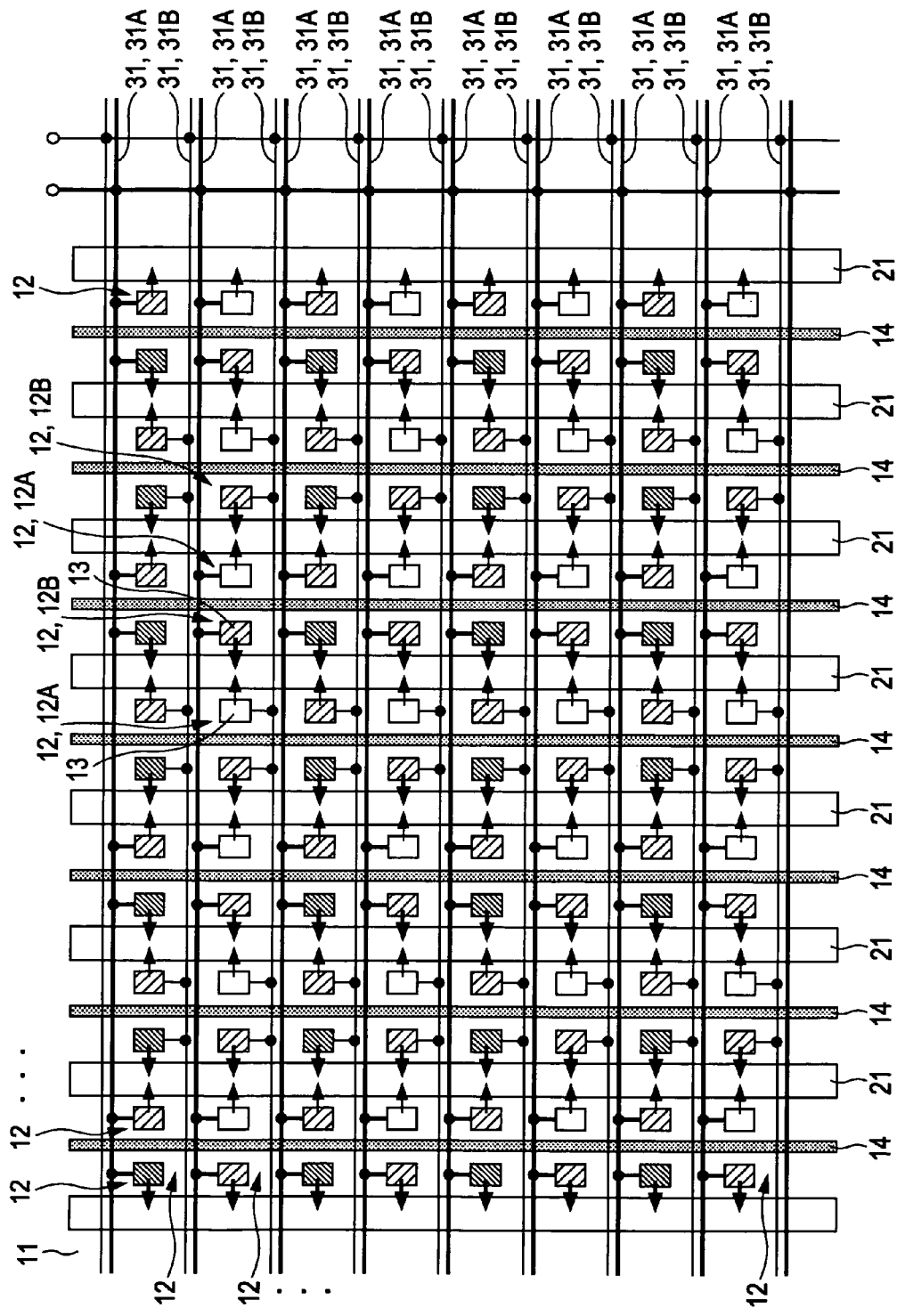
Figure 19:
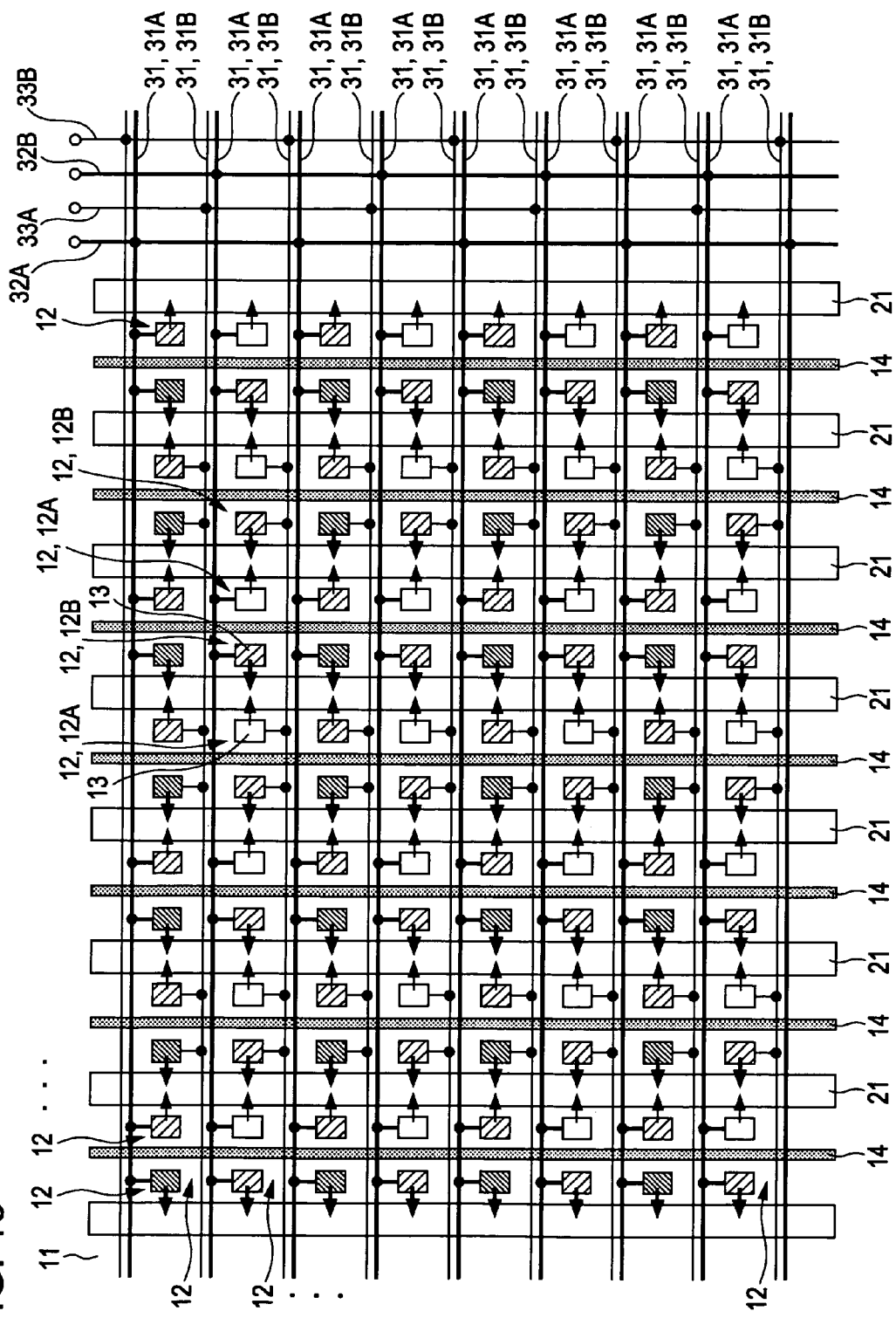
Figure 20:
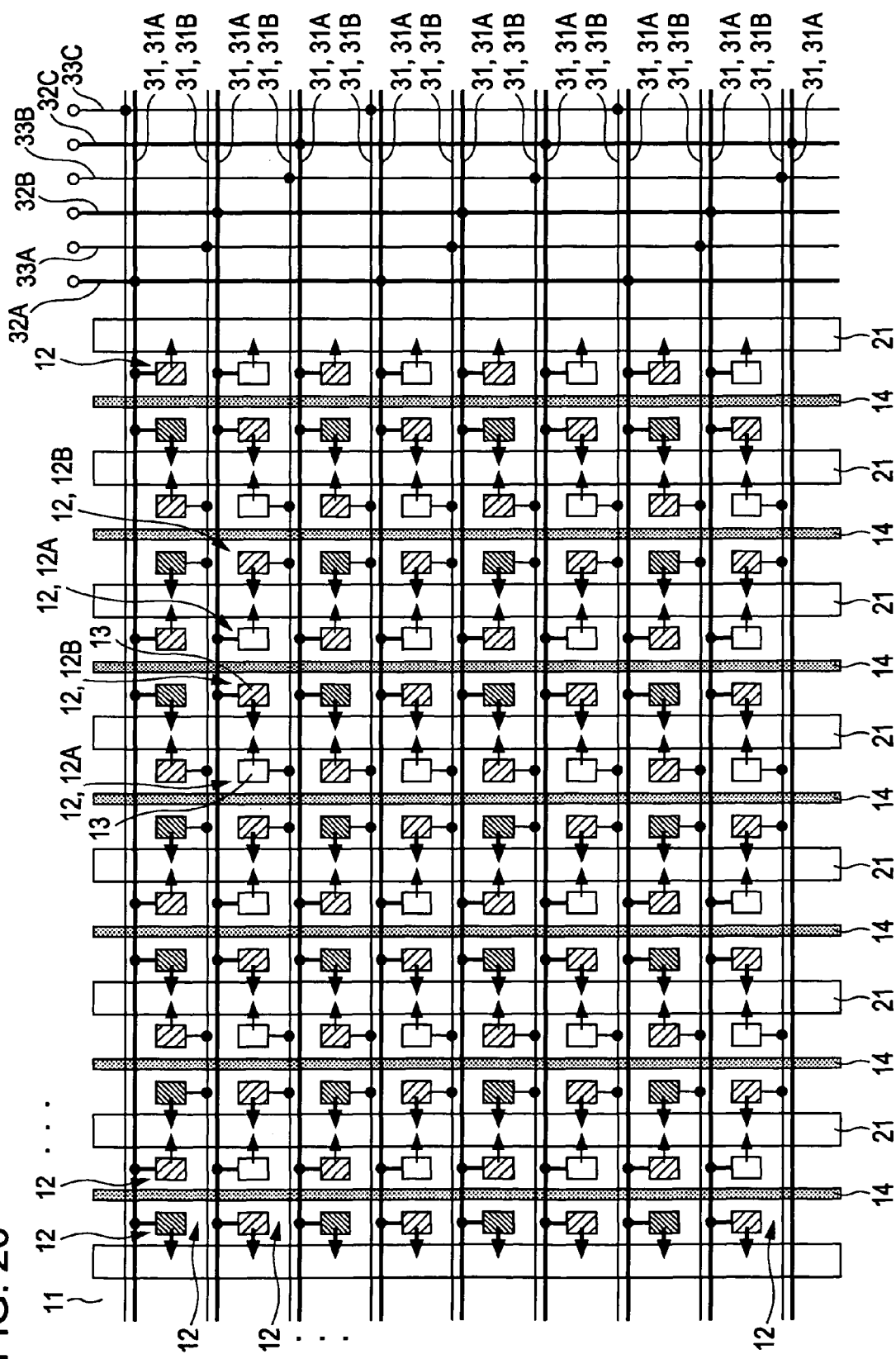
Figure 21:
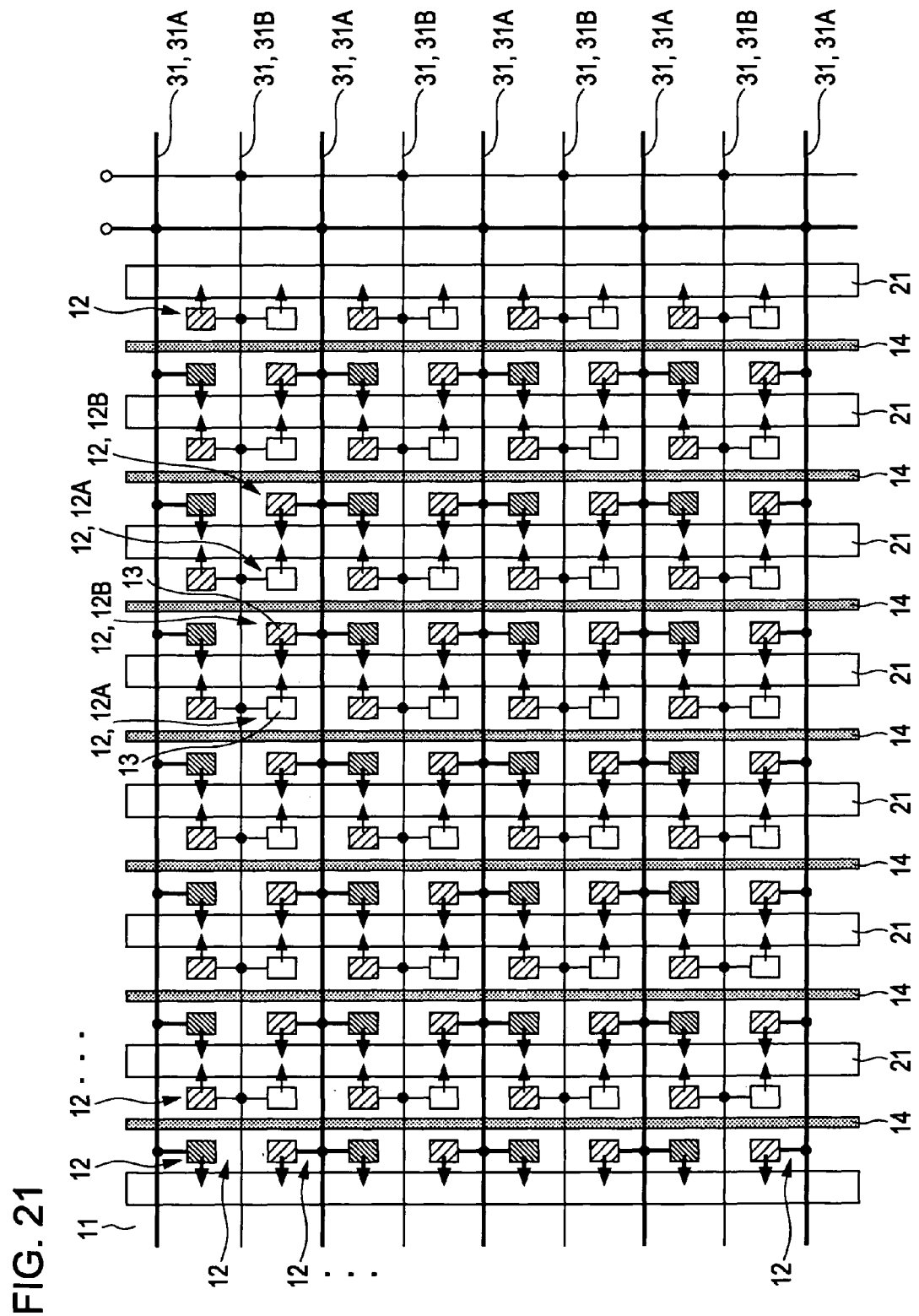
Figure 22:
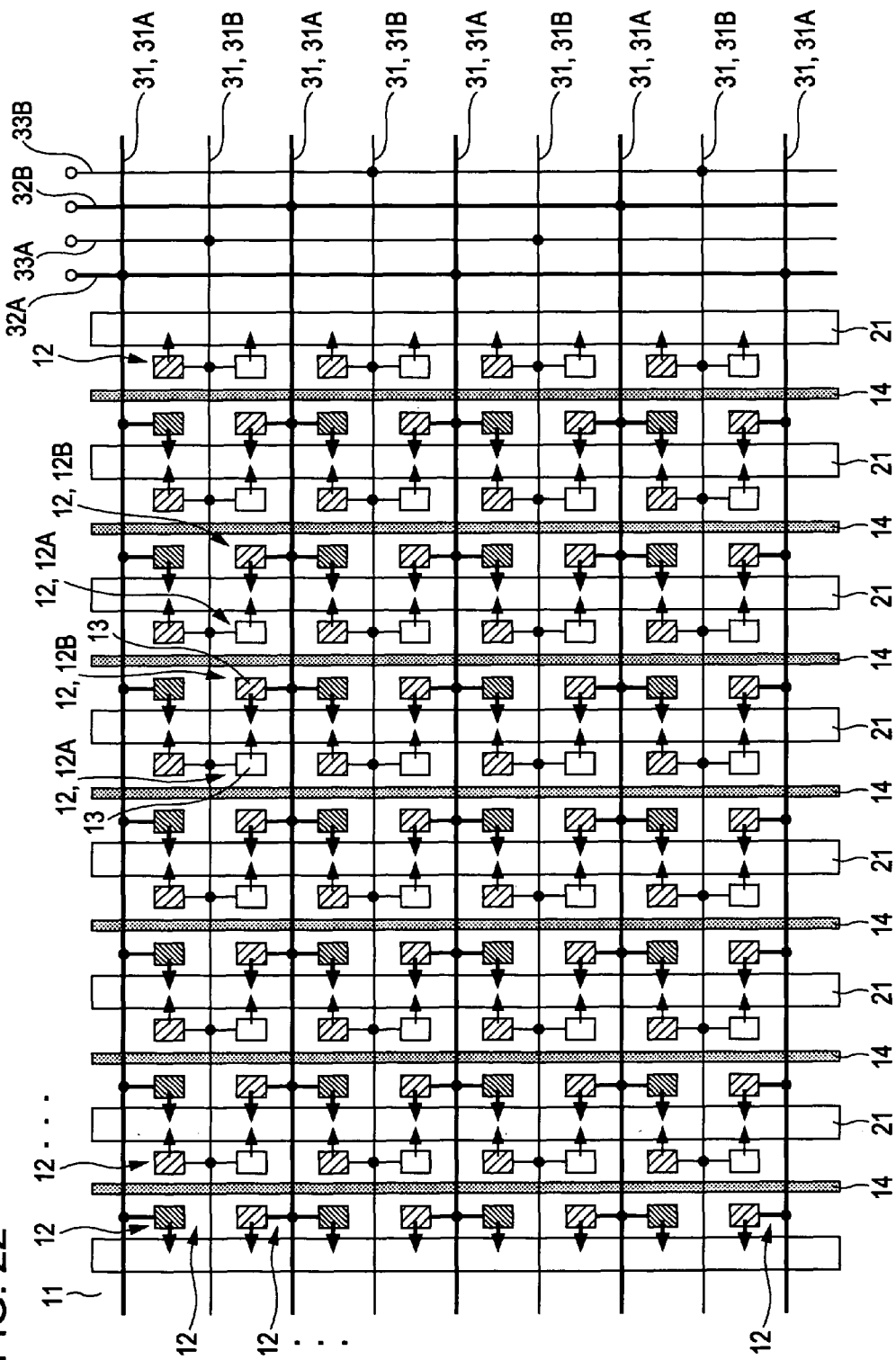
Figure 23:
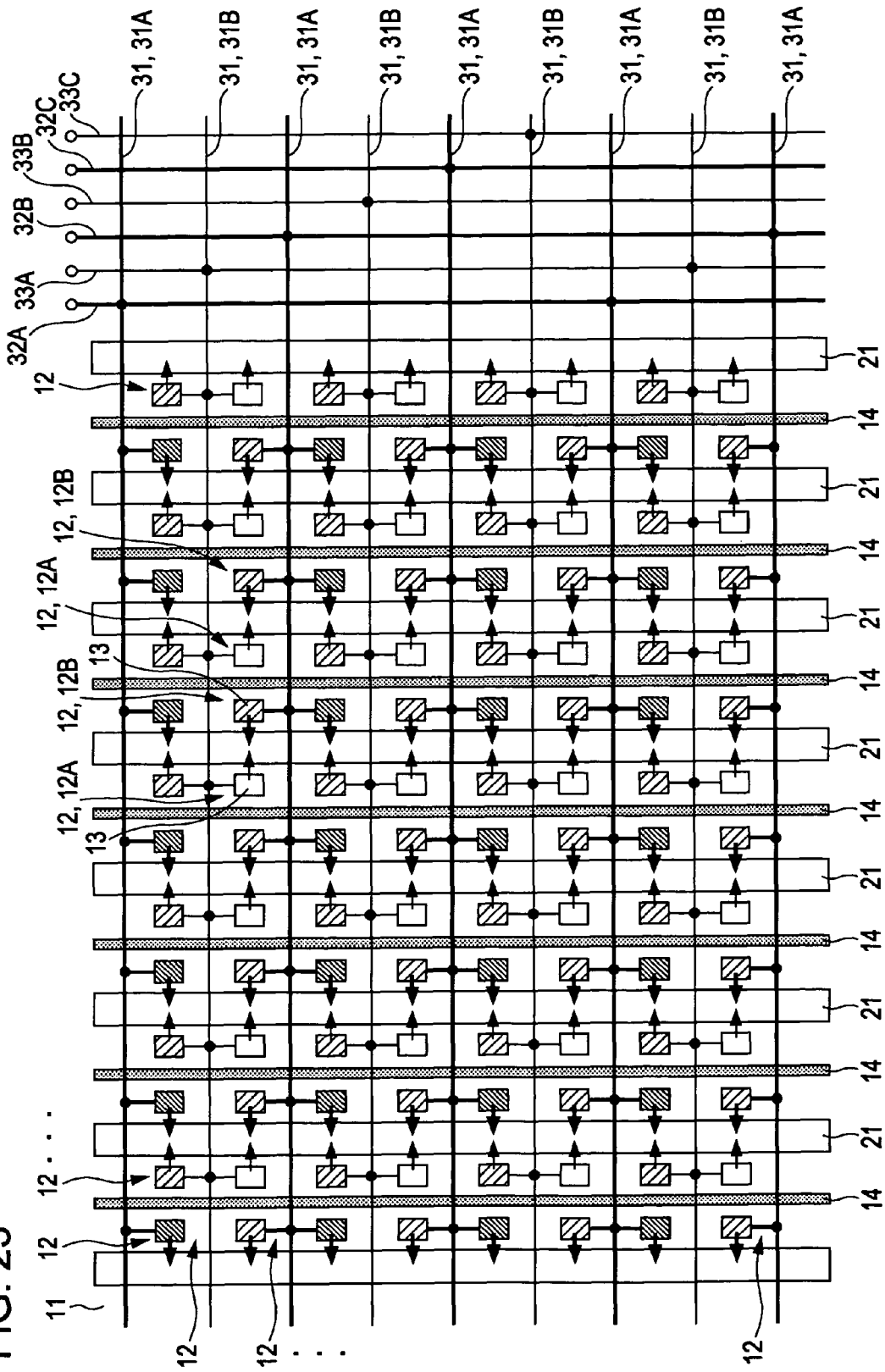
Figure 24:
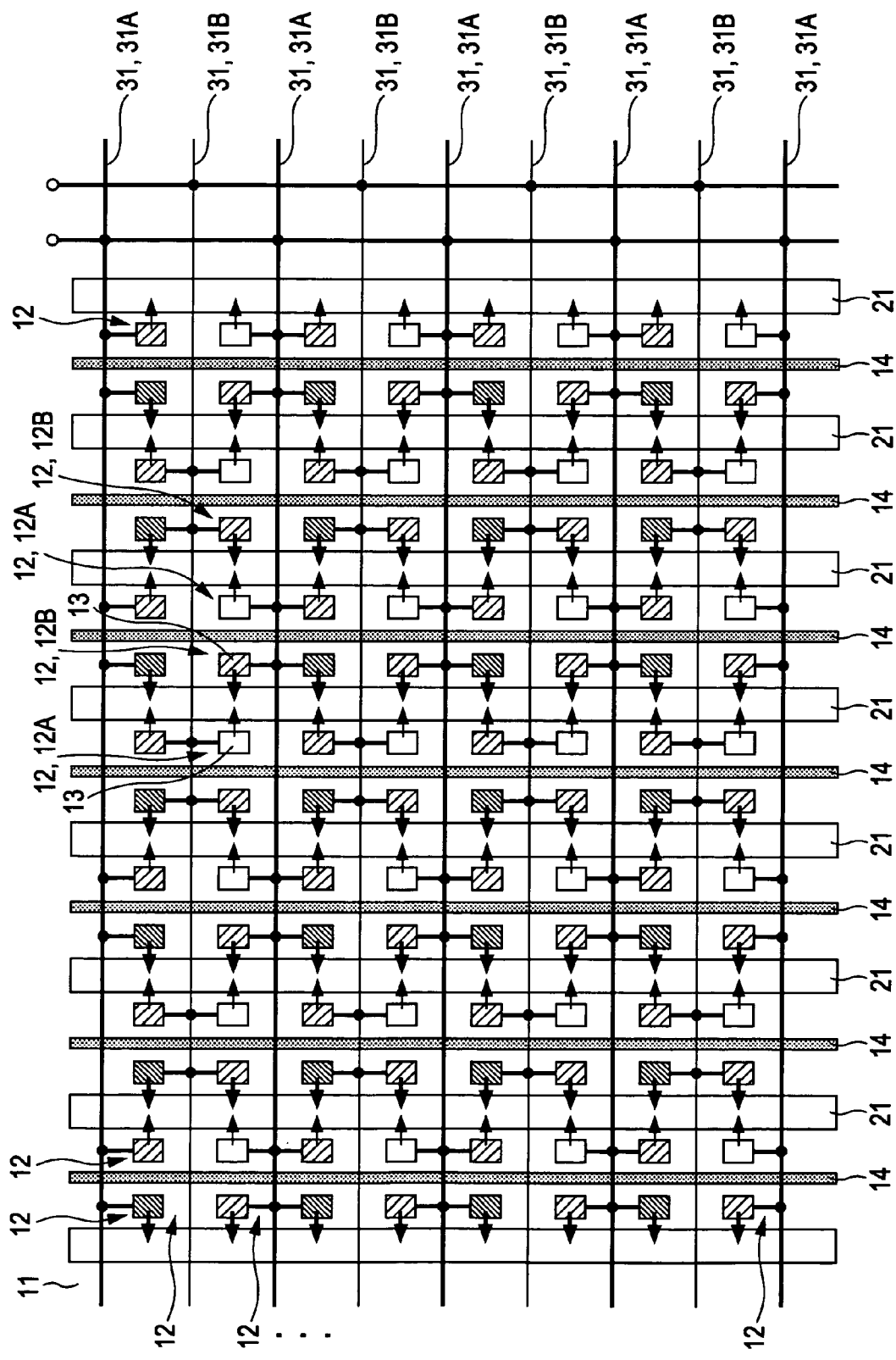
Figure 25:
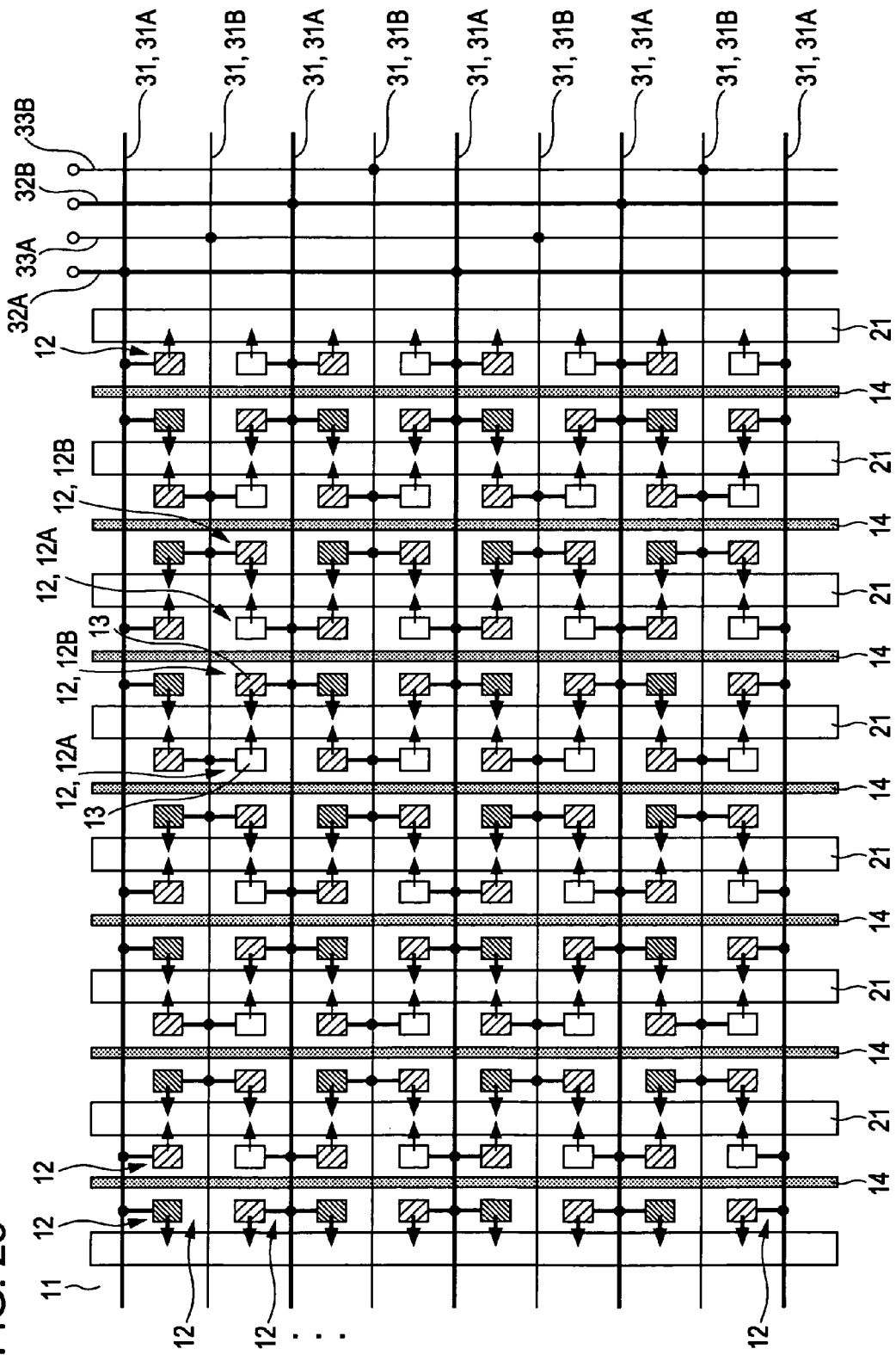
Figure 26:
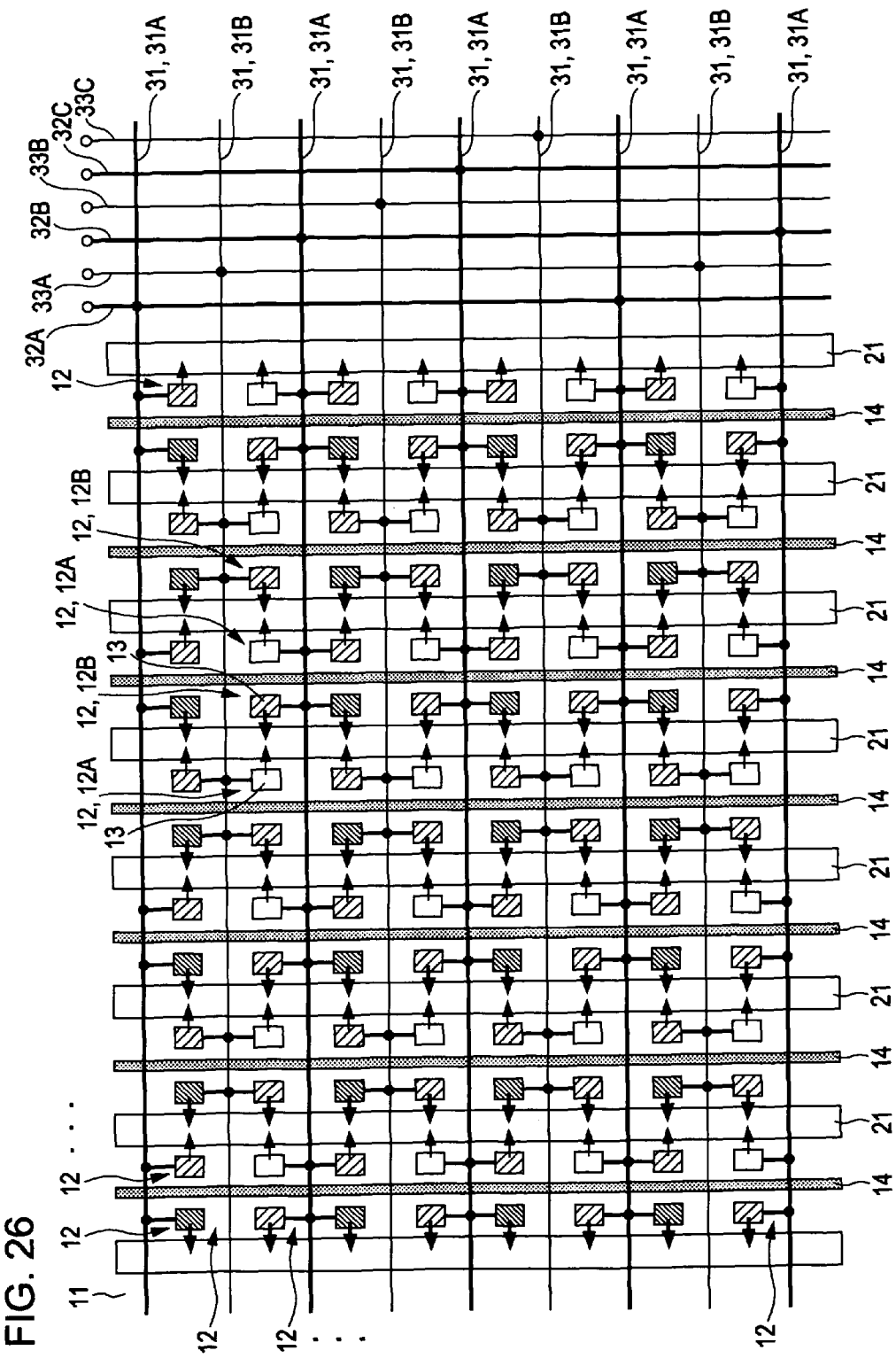
Figure 27:
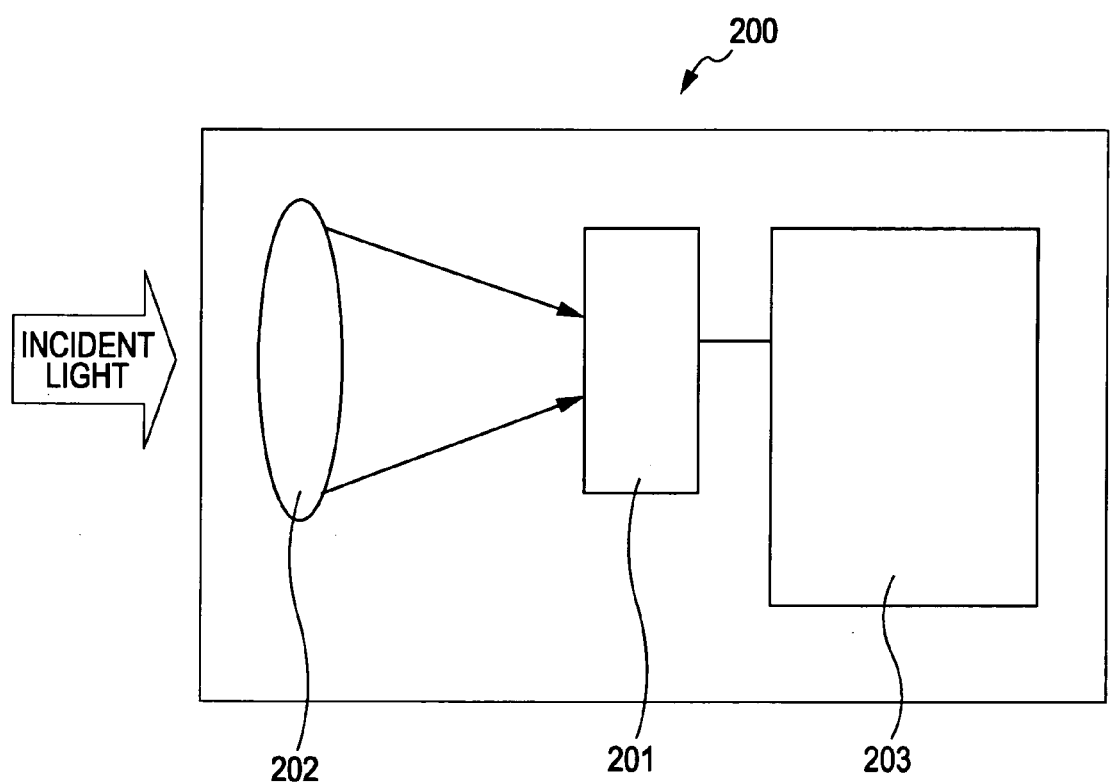

is a plan layout view, (2) is a cross-sectional view taken along line A-A', and (3) is a cross-sectional view taken along line B-B';

FIG. 9 is a diagram illustrating a ninth example of the configuration of a solid-state imaging device according to a third embodiment of the present invention, wherein (1) is a plan layout view, (2) is a cross-sectional view taken along line A-A', and (3) is a cross-sectional view taken along line B-B';

FIG. 10 is a diagram illustrating a tenth example of the configuration of the solid-state imaging device according to the third embodiment of the present invention, wherein (1) is a plan layout view, (2) is a cross-sectional view taken along line A-A', and (3) is a cross-sectional view taken along line B-B';

FIG. 11 is a diagram illustrating an eleventh example of the configuration of the solid-state imaging device according to the third embodiment of the present invention, wherein (1) is a plan layout view, (2) is a cross-sectional view taken along line A-A', and (3) is a cross-sectional view taken along line B-B';

FIG. 12 is a diagram illustrating a twelfth example of the configuration of the solid-state imaging device according to the third embodiment of the present invention, wherein (1) is a plan layout view, (2) is a cross-sectional view taken along line A-A', and (3) is a cross-sectional view taken along line B-B';

FIG. 13 is a diagram illustrating a thirteenth example of the configuration of the solid-state imaging device according to the third embodiment of the present invention, wherein (1) is a plan layout view, (2) is a cross-sectional view taken along line A-A', and (3) is a cross-sectional view taken along line B-B';

FIG. 14 is a diagram illustrating a fourteenth example of the configuration of the solid-state imaging device according to the third embodiment of the present invention, wherein (1) is a plan layout view, (2) is a cross-sectional view taken along line A-A', and (3) is a cross-sectional view taken along line B-B';

FIG. 15 is a plan layout view illustrating a first example of a readout method for a solid-state imaging device according to a fourth embodiment of the present invention;

FIG. 16 is a plan layout view illustrating a second example of the readout method for the solid-state imaging device according to the fourth embodiment of the present invention;

FIG. 17 is a plan layout view illustrating a third example of the readout method for the solid-state imaging device according to the fourth embodiment of the present invention;

FIG. 18 is a plan layout view illustrating a fourth example of the readout method for the solid-state imaging device according to the fourth embodiment of the present invention;

FIG. 19 is a plan layout view illustrating a fifth example of the readout method for the solid-state imaging device according to the fourth embodiment of the present invention;

FIG. 20 is a plan layout view illustrating a sixth example of the readout method for the solid-state imaging device according to the fourth embodiment of the present invention;

FIG. 21 is a plan layout view illustrating a seventh example of a readout method for a solid-state imaging device according to a fifth embodiment of the present invention;

FIG. 22 is a plan layout view illustrating an eighth example of the readout method for the solid-state imaging device according to the fifth embodiment of the present invention;

FIG. 23 is a plan layout view illustrating a ninth example of the readout method for the solid-state imaging device according to the fifth embodiment of the present invention;

FIG. 24 is a plan layout view illustrating a tenth example of the readout method for the solid-state imaging device according to the fifth embodiment of the present invention;

FIG. 25 is a plan layout view illustrating an eleventh example of the readout method for the solid-state imaging device according to the fifth embodiment of the present invention;

FIG. 26 is a plan layout view illustrating a twelfth example of the readout method for the solid-state imaging device according to the fifth embodiment of the present invention; and FIG. 27 is a block diagram illustrating an imaging device example to which a solid-state imaging device according to an embodiment of the present invention has been applied.

DESCRIPTION OF THE PREFERRED EMBODIMENTS

Preferred embodiments (hereinafter, simply referred to as embodiments) of the present invention will be described below.

1. First Embodiment (First Example of Configuration of Solid-state Imaging device)

2. First Embodiment (Second Example of Configuration of Solid-state Imaging device)

3. First Embodiment (Third Example of Configuration of Solid-state Imaging device)

4. First Embodiment (Fourth Example of Configuration of Solid-state Imaging device)

5. Second Embodiment (Fifth Example of Configuration of Solid-state Imaging device)

6. Second Embodiment (Sixth Example of Configuration of Solid-state Imaging device)

7. Second Embodiment (Seventh Example of Configuration of Solid-state Imaging device)

8. Second Embodiment (Eighth Example of Configuration of Solid-state Imaging device)

9. Third Embodiment (Ninth Example of Configuration of Solid-state Imaging device)

10. Third Embodiment (Tenth Example of Configuration of Solid-state Imaging device)

11. Third Embodiment (Eleventh Example of Configuration of Solid-state Imaging device)

12. Third Embodiment (Twelfth Example of Configuration of Solid-state Imaging device)

13. Third Embodiment (Thirteenth Example of Configuration of Solid-state Imaging device)

14. Third Embodiment (Fourteenth Example of Configuration of Solid-state Imaging device)

15. Fourth Embodiment (First Example of Readout Method for Solid-state Imaging device)

16. Fourth Embodiment (Second Example of Readout Method for Solid-state Imaging device)

17. Fourth Embodiment (Third Example of Readout Method for Solid-state Imaging device)

18. Fourth Embodiment (Fourth Example of Readout Method for Solid-state Imaging device)

19. Fourth Embodiment (Fifth Example of Readout Method for Solid-state Imaging device)

20. Fourth Embodiment (Sixth Example of Readout Method for Solid-state Imaging device)

21. Fifth Embodiment (Seventh Example of Readout Method for Solid-state Imaging device)

22. Fifth Embodiment (Eighth Example of Readout Method for Solid-state Imaging device)

23. Fifth Embodiment (Ninth Example of Readout Method for Solid-state Imaging device)

24. Fifth Embodiment (Tenth Example of Readout Method for Solid-state Imaging device)

25. Fifth Embodiment (Eleventh Example of Readout Method for Solid-state Imaging device)

26. Fifth Embodiment (Twelfth Example of Readout Method for Solid-state Imaging device)

27. Application Examples of First through Fifth Embodiments (Example Applied to Imaging device)

1. First Embodiment

First Example of Configuration of Solid-State Imaging Device

A first embodiment of the present invention (first example of the configuration of a solid-state imaging device) will be described with the plan layout view in (1) in FIG. 1, the cross-sectional view taken along line A-A' in (2) in FIG. 1, and the cross-sectional view taken along line B-B' in (3) in FIG. 1.

Figure 1:
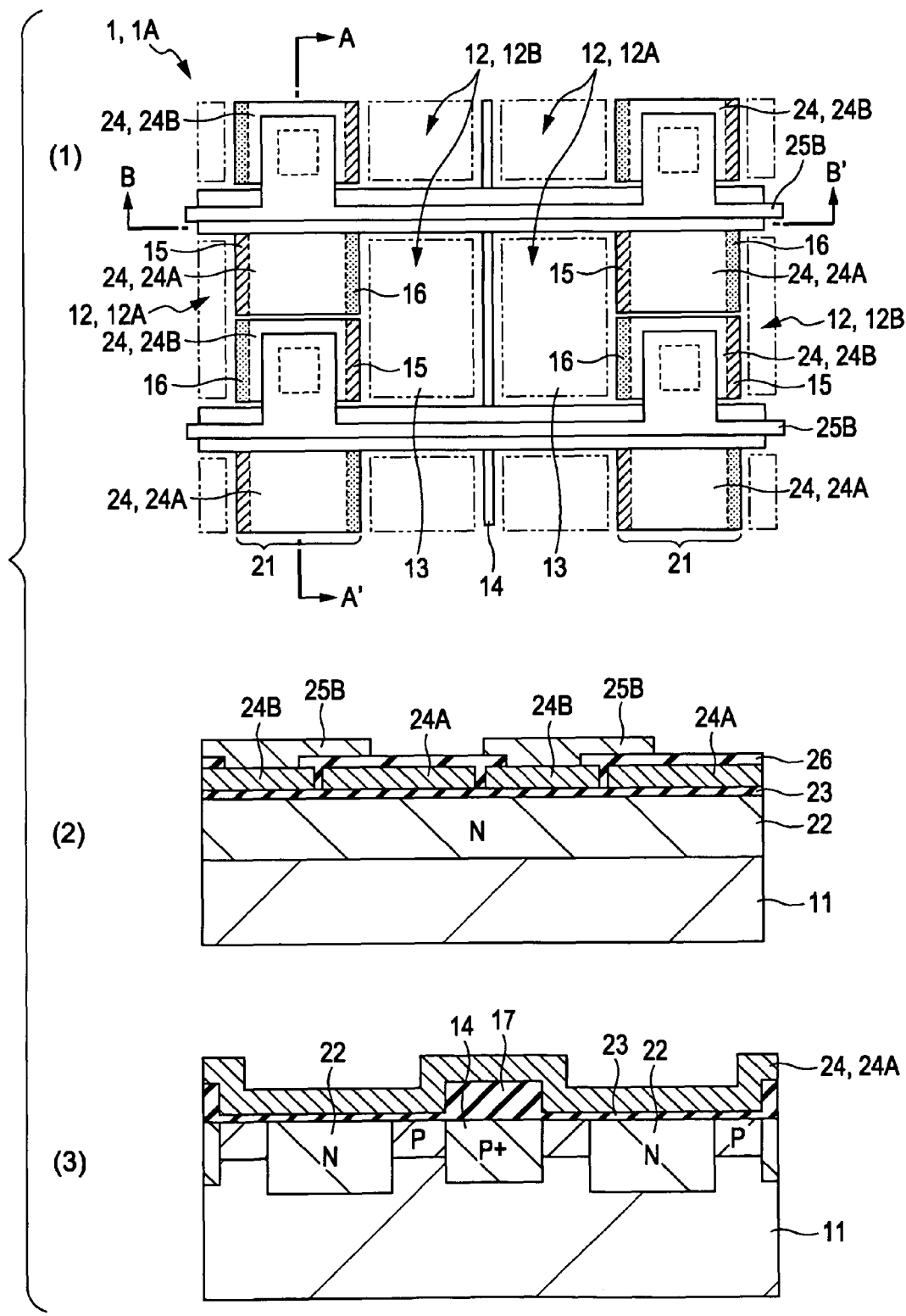
FIG. 1 is a diagram illustrating a first example of the configuration of a solid-state imaging device according to a first embodiment of the present invention, wherein (1) is a plan layout view, (2) is a cross-sectional view taken along line A-A', and (3) is a cross-sectional view taken along line B-B'.

As shown in FIG. 1, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are formed of, for example, first transfer electrodes 24A, and second transfer electrodes 24B. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B via an insulating layer 26.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 and a second channel stop portion 16 formed in a direction parallel to the vertical transfer direction are formed between the two pixels 12 (12A and 12B) on both sides of the vertical CCD shift register 21.

An insulating layer 17 which is thicker than the gate insulating layer 23 of the vertical CCD shift register 21 is formed above the first channel stop portion 16.

The transfer electrodes 24 of the vertical CCD shift register 21 also serve as the readout electrodes of the readout gate portion 15.

Also, the readout electrodes formed in the first transfer electrodes 24A are formed in the horizontal transfer direction each pixel. Also, the readout electrodes formed in the second transfer electrodes 24B are formed with pixels wherein the readout electrodes formed in the first transfer electrodes 24A are not formed in the horizontal transfer direction. That is to say, the readout electrodes formed in the second transfer electrodes 24B are also formed in the horizontal transfer direction each pixel. Thus, a solid-state imaging device 1 (1A) is formed.

With the solid-state imaging device 1 (1A), the insulating layer 17 formed above the first channel stop portion 14 is formed thicker than the gate insulating layer 23 of the vertical CCD shift register 21, and accordingly, even in the event that readout voltage is applied to between the pixels 12 (12A) and 12 (12A), or between the pixels 12 (12B) and 12 (12B) in the vertical transfer direction, in between the pixels 12 (12A) and 12 (12A), or between the pixels 12 (12B) and 12 (12B) is not depleted. Therefore, an advantage is provided wherein occurrence of color mixture between pixels can be suppressed. Moreover, the vertical CCD shift register 21 is shared by the two pixels 12 (12A and 12B) adjacent in the horizontal transfer direction, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

2. First Embodiment

Second Example of Configuration of Solid-State Imaging Device

The first embodiment of the present invention (second example of the configuration of the solid-state imaging device) will be described with the plan layout view in (1) in FIG. 2, the cross-sectional view taken along line A-A' in (2) in FIG. 2, and the cross-sectional view taken along line. B-B' in (3) in FIG. 2.

Figure 2:
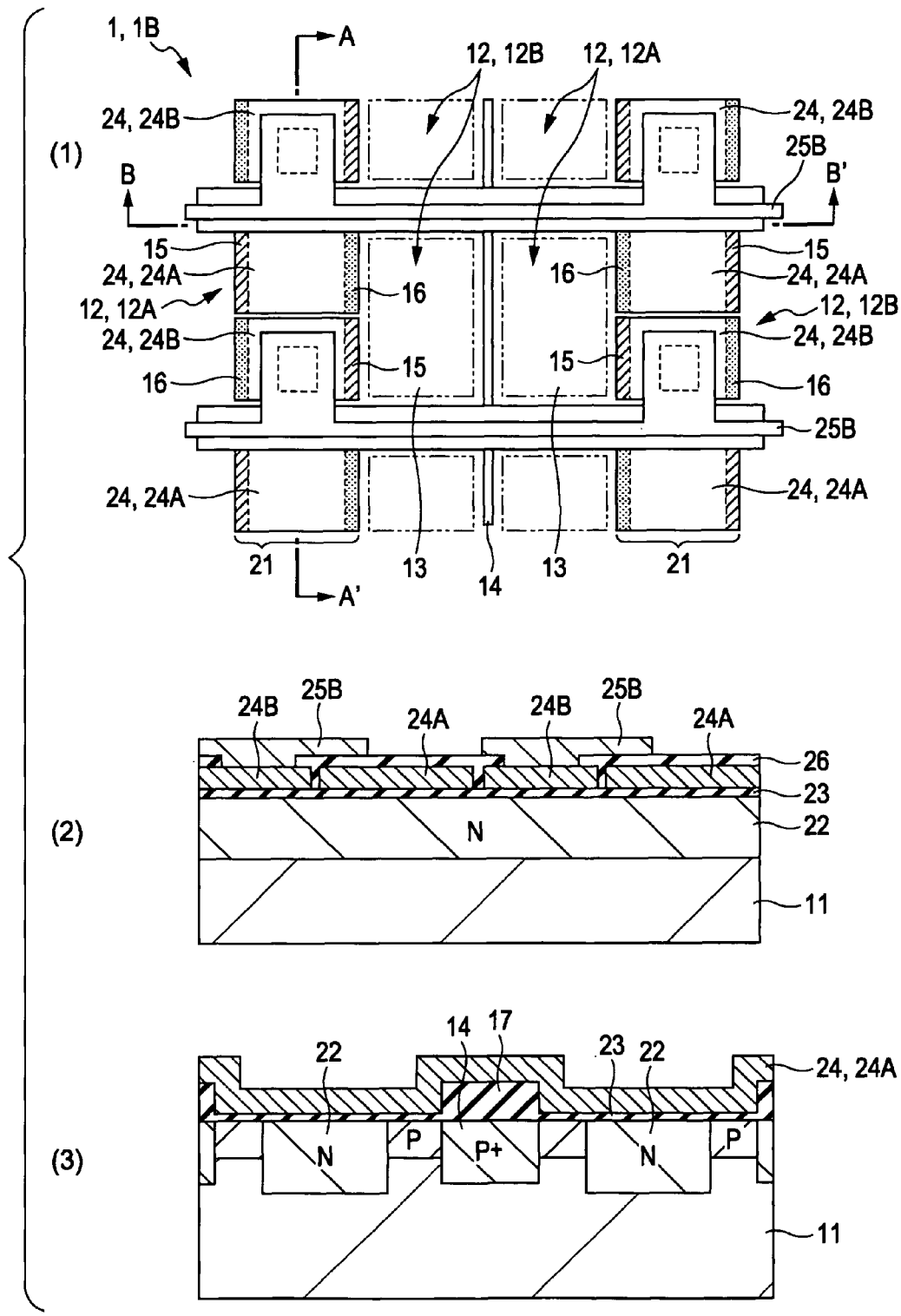
FIG. 2 is a diagram illustrating a second example of the configuration of the solid-state imaging device according to the first embodiment of the present invention, wherein (1) is a plan layout view, (2) is a cross-sectional view taken along line A-A', and (3) is a cross-sectional view taken along line B-B'.

As shown in FIG. 2, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are formed of, for example, first transfer electrodes 24A, and second transfer electrodes 24B. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B via an insulating layer 26.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 and a second channel stop portion 16 formed in a direction parallel to the vertical transfer direction are formed between the two pixels 12 (12A and 12B) on both sides of the vertical CCD shift register 21.

An insulating layer 17 which is thicker than the gate insulating layer 23 of the vertical CCD shift register 21 is formed above the first channel stop portion 16.

The transfer electrodes 24 of the vertical CCD shift register 21 also serve as the readout electrodes of the readout gate portion 15.

Also, the readout electrodes formed in the first transfer electrodes 24A are formed in the horizontal transfer direction every two pixels. Also, the readout electrodes formed in the second transfer electrodes 24B are formed with pixels wherein the readout electrodes formed in the first transfer electrodes 24A are not formed in the horizontal transfer direction. That is to say, the readout electrodes formed in the second transfer electrodes 24B are also formed in the horizontal transfer direction every two pixels. Thus, a solid-state imaging device 1 (1B) is formed.

With the solid-state imaging device 1 (1B), the insulating layer 17 formed above the first channel stop portion 14 is formed thicker than the gate insulating layer 23 of the vertical CCD shift register 21, and accordingly, even in the event that readout voltage is applied to between the pixels 12 (12A) and 12 (12A), or between the pixels 12 (12B) and 12 (12B) in the vertical transfer direction, in between the pixels 12 (12A) and 12 (12A), or between the pixels 12 (12B) and 12 (12B) is not depleted. Therefore, an advantage is provided wherein occurrence of color mixture between pixels can be suppressed. Moreover, the vertical CCD shift register 21 is shared by the two pixels 12 (12A and 12B) adjacent in the horizontal transfer direction, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

3. First Embodiment

Third Example of Configuration of Solid-State Imaging Device

The first embodiment of the present invention (third example of the configuration of the solid-state imaging device) will be described with the plan layout view in (1) in FIG. 3, the cross-sectional view taken along line A-A' in (2) in FIG. 3, and the cross-sectional view taken along line B-B' in (3) in FIG. 3.

Figure 3:
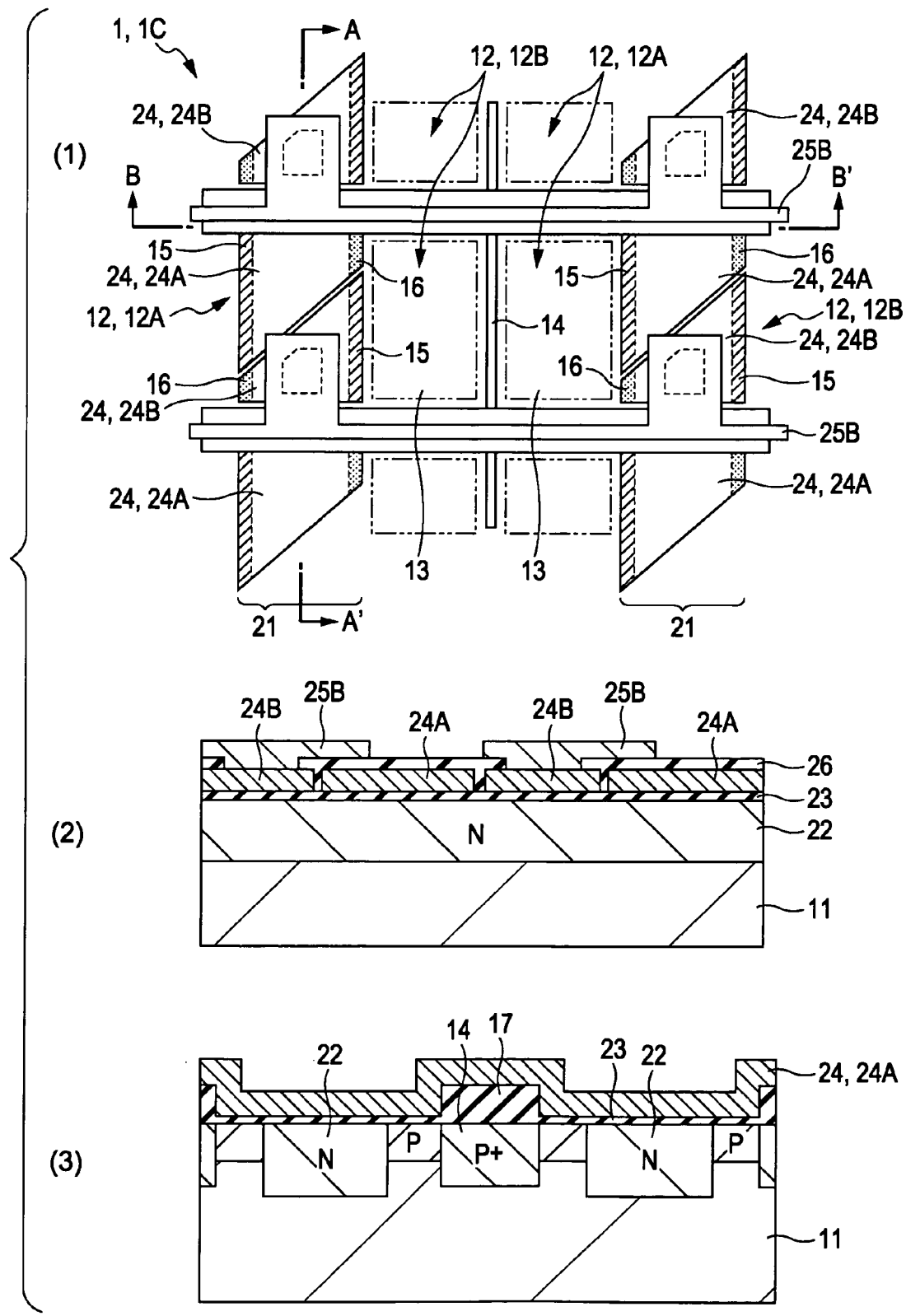
FIG. 3 is a diagram illustrating a third example of the configuration of the solid-state imaging device according to the first embodiment of the present invention, wherein (1) is a plan layout view, (2) is a cross-sectional view taken along line A-A', and (3) is a cross-sectional view taken along line B-B'.

As shown in FIG. 3, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are formed of, for example, first transfer electrodes 24A, and second transfer electrodes 24B. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B via an insulating layer 26.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 and a second channel stop portion 16 formed in a direction parallel to the vertical transfer direction are formed between the two pixels 12 (12A and 12B) on both sides of the vertical CCD shift register 21.

An insulating layer 17 which is thicker than the gate insulating layer 23 of the vertical CCD shift register 21 is formed above the first channel stop portion 16.

Also, the readout gate portion 15 in the vertical transfer direction is formed longer than the second channel stop portion 16 in the vertical transfer direction thereof.

The transfer electrodes 24 of the vertical CCD shift register 21 also serve as the readout electrodes of the readout gate portion 15.

Also, the readout electrodes formed in the first transfer electrodes 24A are formed in the horizontal transfer direction each pixel. Also, the readout electrodes formed in the second transfer electrodes 24B are formed with pixels wherein the readout electrodes formed in the first transfer electrodes 24A are not formed in the horizontal transfer direction. That is to say, the readout electrodes formed in the second transfer electrodes 24B are also formed in the horizontal transfer direction each pixel. Thus, a solid-state imaging device 1 (1C) is formed.

With the solid-state imaging device 1 (1C), the insulating layer 17 formed above the first channel stop portion 14 is formed thicker than the gate insulating layer 23 of the vertical CCD shift register 21, and accordingly, even in the event that readout voltage is applied to between the pixels 12 (12A) and 12 (12A), or between the pixels 12 (12B) and 12 (12B) in the vertical transfer direction, in between the pixels 12 (12A) and 12 (12A), or between the pixels 12 (12B) and 12 (12B) is not depleted. Therefore, an advantage is provided wherein occurrence of color mixture between pixels can be suppressed. Moreover, the vertical CCD shift register 21 is shared by the two pixels 12 (12A and 12B) adjacent in the horizontal transfer direction, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

Also, the readout gate portion 15 in the same vertical transfer direction is formed longer than the second channel stop portion 16. Thus, of the second channel stop portion 16 side where readout is not executed, e.g., inverse readout from the photo sensor of the pixel 12A is prevented, and accordingly, readout from the photo sensor 13 of the pixel 12B can be executed smoothly.

Therefore, in order that the electrode length of the readout gate portion 15 side where the transfer electrodes (second transfer electrodes 24B) are shared is longer than the electrode length of the second channel stop portion 16 side at which readout is not executed where the transfer electrodes 24 (second transfer electrodes 24B) are shared, for example, the facing surfaces between the first transfer electrodes 24A and the second transfer electrodes 24B are formed in an obliquely-cut shape on the plan layout.

4. First Embodiment

Fourth Example of Configuration of Solid-State Imaging Device

Next, the first embodiment of the present invention (fourth example of the configuration of the solid-state imaging device) will be described with the plan layout view in (1) in FIG. 4, the cross-sectional view taken along line A-A' in (2) in FIG. 4, and the cross-sectional view taken along line B-B' in (3) in FIG. 4.

Figure 4:
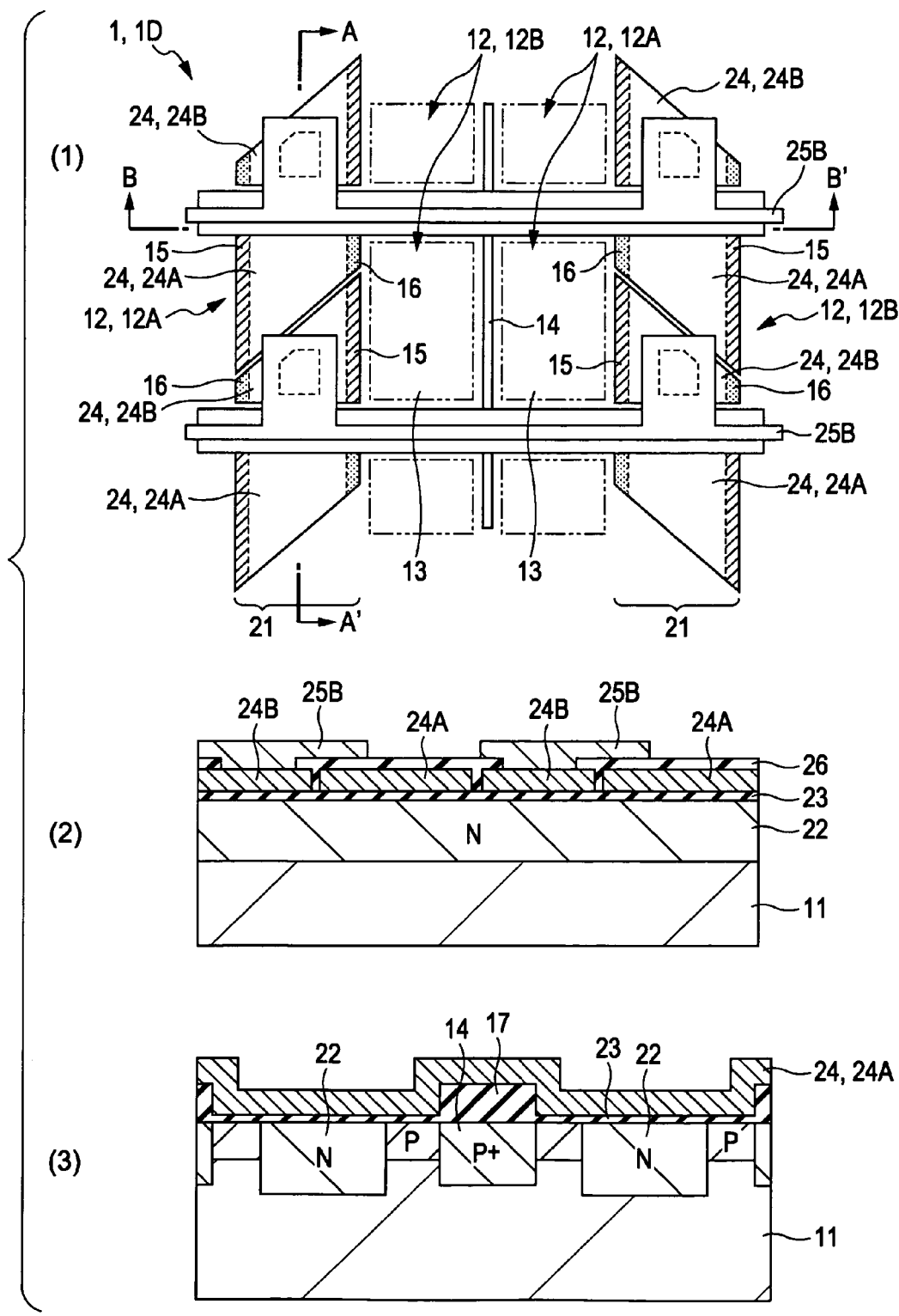
FIG. 4 is a diagram illustrating a fourth example of the configuration of the solid-state imaging device according to the first embodiment of the present invention, wherein (1) is a plan layout view, (2) is a cross-sectional view taken along line A-A', and (3) is a cross-sectional view taken along line B-B'.

As shown in FIG. 4, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are formed of, for example, first transfer electrodes 24A, and second transfer electrodes 24B. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B via an insulating layer 26.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 and a second channel stop portion 16 formed in a direction parallel to the vertical transfer direction are formed between the two pixels 12 (12A and 12B) on both sides of the vertical CCD shift register 21.

An insulating layer 17 which is thicker than the gate insulating layer 23 of the vertical CCD shift register 21 is formed above the first channel stop portion 16.

Also, the readout gate portion 15 in the vertical transfer direction is formed longer than the second channel stop portion 16 in the vertical transfer direction thereof.

The transfer electrodes 24 of the vertical CCD shift register 21 also serve as the readout electrodes of the readout gate portion 15.

Also, the readout electrodes formed in the first transfer electrodes 24A are formed in the horizontal transfer direction every two pixels. Also, the readout electrodes formed in the second transfer electrodes 24B are formed with pixels wherein the readout electrodes formed in the first transfer electrodes 24A are not formed in the horizontal transfer direction. That is to say, the readout electrodes formed in the second transfer electrodes 24B are also formed in the horizontal transfer direction every two pixels. Thus, a solid-state imaging device 1 (1D) is formed.

With the solid-state imaging device 1 (1D), the insulating layer 17 formed above the first channel stop portion 14 is formed thicker than the gate insulating layer 23 of the vertical CCD shift register 21, and accordingly, even in the event that readout voltage is applied to between the pixels 12 (12A) and 12 (12A), or between the pixels 12 (12B) and 12 (12B) in the vertical transfer direction, in between the pixels 12 (12A) and 12 (12A), or between the pixels 12 (12B) and 12 (12B) is not depleted. Therefore, an advantage is provided wherein occurrence of color mixture between pixels can be suppressed. Moreover, the vertical CCD shift register 21 is shared by the two pixels 12 (12A and 12B) adjacent in the horizontal transfer direction, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

Also, the readout gate portion 15 in the same vertical transfer direction is formed longer than the second channel stop portion 16. Thus, of the second channel stop portion 16 side where readout is not executed, e.g., inverse readout from the photo sensor of the pixel 12A is prevented, and accordingly, readout from the photo sensor 13 of the pixel 12B can be executed smoothly.

Therefore, in order that the electrode length of the readout gate portion 15 side where the transfer electrodes (second transfer electrodes 24B) are shared is longer than the electrode length of the second channel stop portion 16 side at which readout is not executed where the transfer electrodes 24 (second transfer electrodes 24B) are shared, for example, the facing surfaces between the first transfer electrodes 24A and the second transfer electrodes 24B are formed in an obliquely-cut shape on the plan layout.

5. Second Embodiment

Fifth Example of Configuration of Solid-State Imaging Device

Next, a second embodiment of the present invention (fifth example of the configuration of a solid-state imaging device) will be described with the plan layout view in (1) in FIG. 5, the cross-sectional view taken along line A-A' in (2) in FIG. 5, and the cross-sectional view taken along line B-B' in (3) in FIG. 5.

Figure 5:
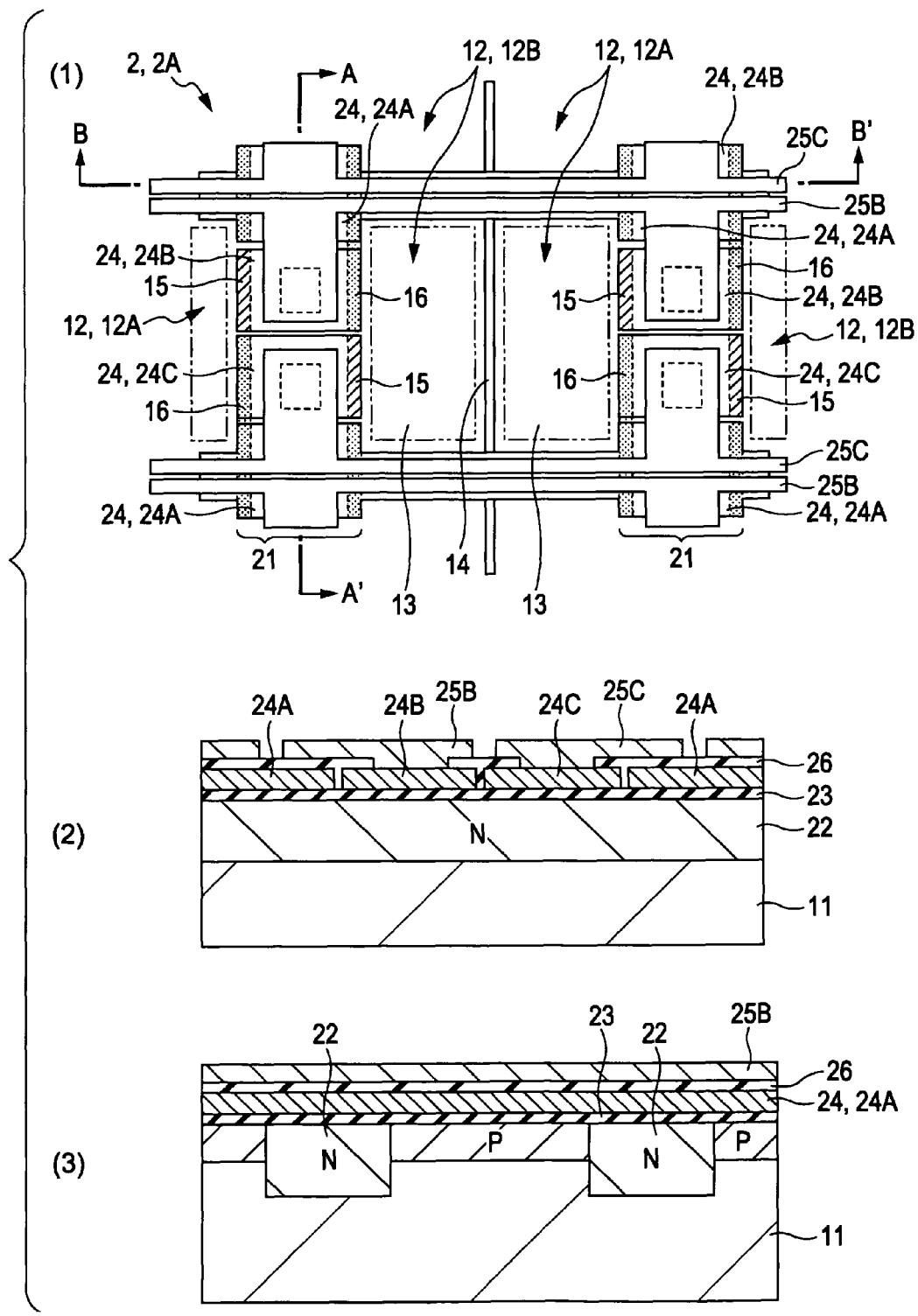
FIG. 5 is a diagram illustrating a fifth example of the configuration of a solid-state imaging device according to a second embodiment of the present invention, wherein (1) is a plan layout view, (2) is a cross-sectional view taken along line A-A', and (3) is a cross-sectional view taken along line B-B'.

As shown in FIG. 5, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are transfer electrodes having a 3-electrode structure per pixel, and are formed of, for example, first transfer electrodes 24A, second transfer electrodes 24B, and third transfer electrodes 24C. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B via an insulating layer 26. Each of the third transfer electrodes 24C in the horizontal transfer direction is connected onto pixels in the horizontal transfer direction by a wiring 25C via the insulating layer 26.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 and a second channel stop portion 16 formed in a direction parallel to the vertical transfer direction are formed between the two pixels 12 (12A and 12B) on both sides of the vertical CCD shift register 21.

One of the transfer electrodes having a 3-electrode structure, e.g., a portion of the third transfer electrodes 24C is formed protruding above the readout gate portion 15 via a readout gate insulating layer (not shown). That is to say, the third transfer electrode 24C thereof also serves as the readout electrode of the readout gate portion 15. Also, with pixels adjacent in the horizontal transfer direction, e.g., a portion of the second transfer electrodes 24B is formed in a protruding manner. That is to say, the second transfer electrode 24B thereof also serves as the readout electrode of the readout gate portion 15.

Also, for example, the readout electrodes formed in the third transfer electrodes 24C are formed in the horizontal transfer direction each pixel. Also, the readout electrodes formed in the second transfer electrodes 24B are formed with pixels wherein the readout electrodes formed in the first transfer electrodes 24A are not formed in the horizontal transfer direction. That is to say, the readout electrodes formed in the second transfer electrodes 24B are also formed in the horizontal transfer direction each pixel. Thus, a solid-state imaging device 2 (2A) is formed.

With the solid-state imaging device 2 (2A), the transfer electrodes 24 of the vertical CCD shift register 21 are transfer electrodes having a 3-electrode structure per pixel, and accordingly, readout voltage is not applied between pixels in the vertical transfer direction (e.g., between the pixels 12A and 12A, or between the pixels 12B and 12B). Therefore, an advantage is provided wherein occurrence of color mixture between pixels can be suppressed.

Moreover, the vertical CCD shift register 21 is shared by the two pixels 12 (12A and 12B) adjacent in the horizontal transfer direction, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

6. Second Embodiment

Sixth Example of Configuration of Solid-State Imaging Device

Next, the second embodiment of the present invention (sixth example of the configuration of the solid-state imaging device) will be described with the plan layout view in (1) in FIG. 6, the cross-sectional view taken along line A-A' in (2) in FIG. 6, and the cross-sectional view taken along line B-B' in (3) in FIG. 6.

Figure 6:
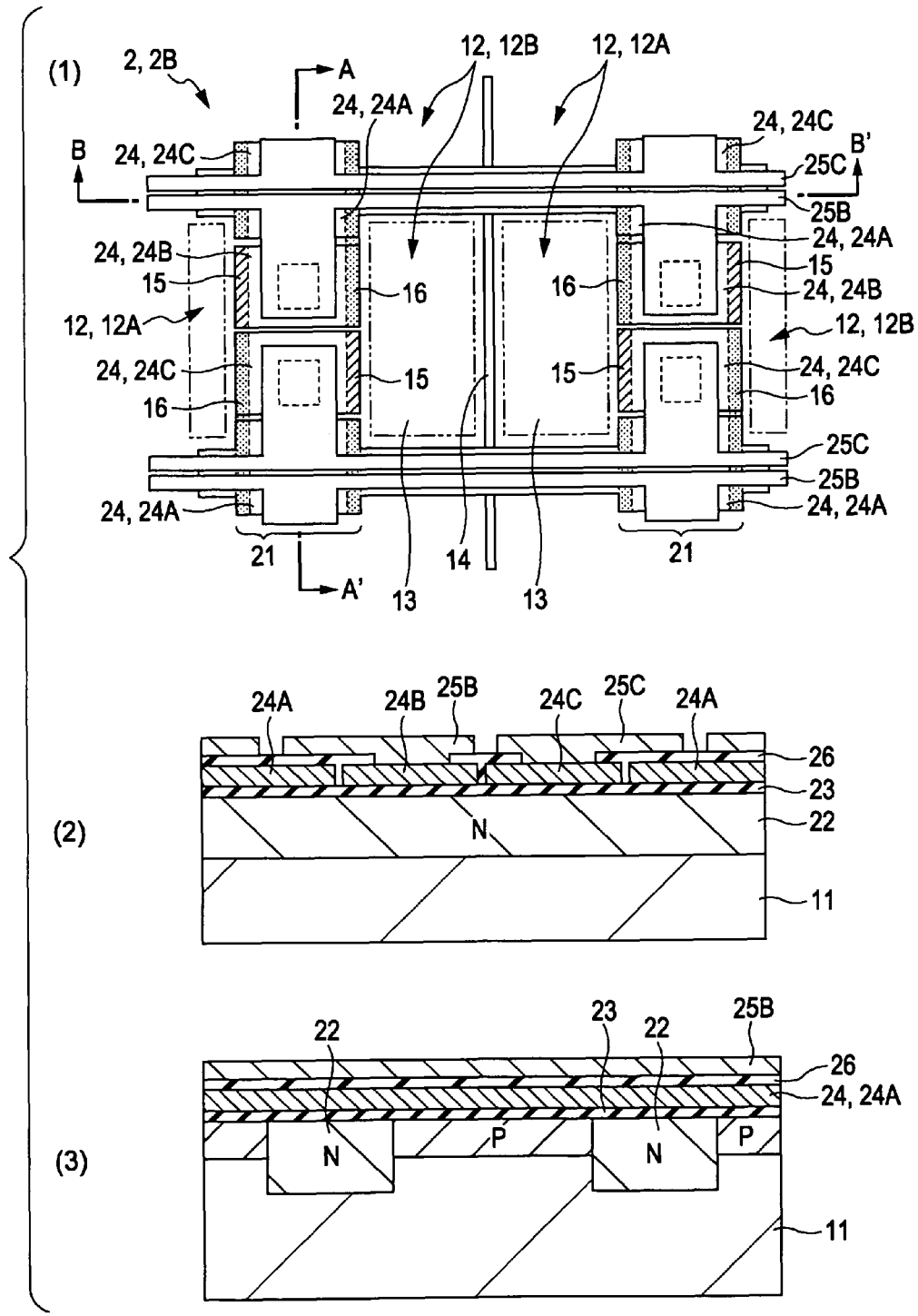
FIG. 6 is a diagram illustrating a sixth example of the configuration of the solid-state imaging device according to the second embodiment of the present invention, wherein (1) is a plan layout view, (2) is a cross-sectional view taken along line A-A', and (3) is a cross-sectional view taken along line B-B'.

As shown in FIG. 6, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are transfer electrodes having a 3-electrode structure per pixel, and are formed of, for example, first transfer electrodes 24A, second transfer electrodes 24B, and third transfer electrodes 24C. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B via an insulating layer 26. Each of the third transfer electrodes 24C in the horizontal transfer direction is connected onto pixels in the horizontal transfer direction by a wiring 25C via the insulating layer 26.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 and a second channel stop portion 16 formed in a direction parallel to the vertical transfer direction are formed between the two pixels 12 (12A and 12B) on both sides of the vertical CCD shift register 21.

One of the transfer electrodes having a 3-electrode structure, e.g., a portion of the third transfer electrodes 24C is formed protruding above the readout gate portion 15 via a readout gate insulating layer (not shown). That is to say, the third transfer electrode 24C thereof also serves as the readout electrode of the readout gate portion 15. Also, with pixels adjacent in the horizontal transfer direction, e.g., a portion of the second transfer electrodes 24B is formed in a protruding manner. That is to say, the second transfer electrode 24B thereof also serves as the readout electrode of the readout gate portion 15.

Also, for example, the readout electrodes formed in the third transfer electrodes 24C are formed in the horizontal transfer direction every two pixels. Also, the readout electrodes formed in the second transfer electrodes 24B are formed with pixels wherein the readout electrodes formed in the first transfer electrodes 24A are not formed in the horizontal transfer direction. That is to say, the readout electrodes formed in the second transfer electrodes 24B are also formed in the horizontal transfer direction every two pixels. Thus, a solid-state imaging device 2 (2B) is formed.

With the solid-state imaging device 2 (2B), the transfer electrodes 24 of the vertical CCD shift register 21 are transfer electrodes having a 3-electrode structure per pixel, and accordingly, readout voltage is not applied between pixels in the vertical transfer direction (e.g., between the pixels 12A and 12A, or between the pixels 12B and 12B). Therefore, an advantage is provided wherein occurrence of color mixture between pixels can be suppressed.

Moreover, the vertical CCD shift register 21 is shared by the two pixels 12 (12A and 12B) adjacent in the horizontal transfer direction, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

7. Second Embodiment

Seventh Example of Configuration of Solid-State Imaging Device

Next, the second embodiment of the present invention (seventh example of the configuration of the solid-state imaging device) will be described with the plan layout view in (1) in FIG. 7, the cross-sectional view taken along line A-A' in (2) in FIG. 7, and the cross-sectional view taken along line B-B' in (3) in FIG. 7.

Figure 7:
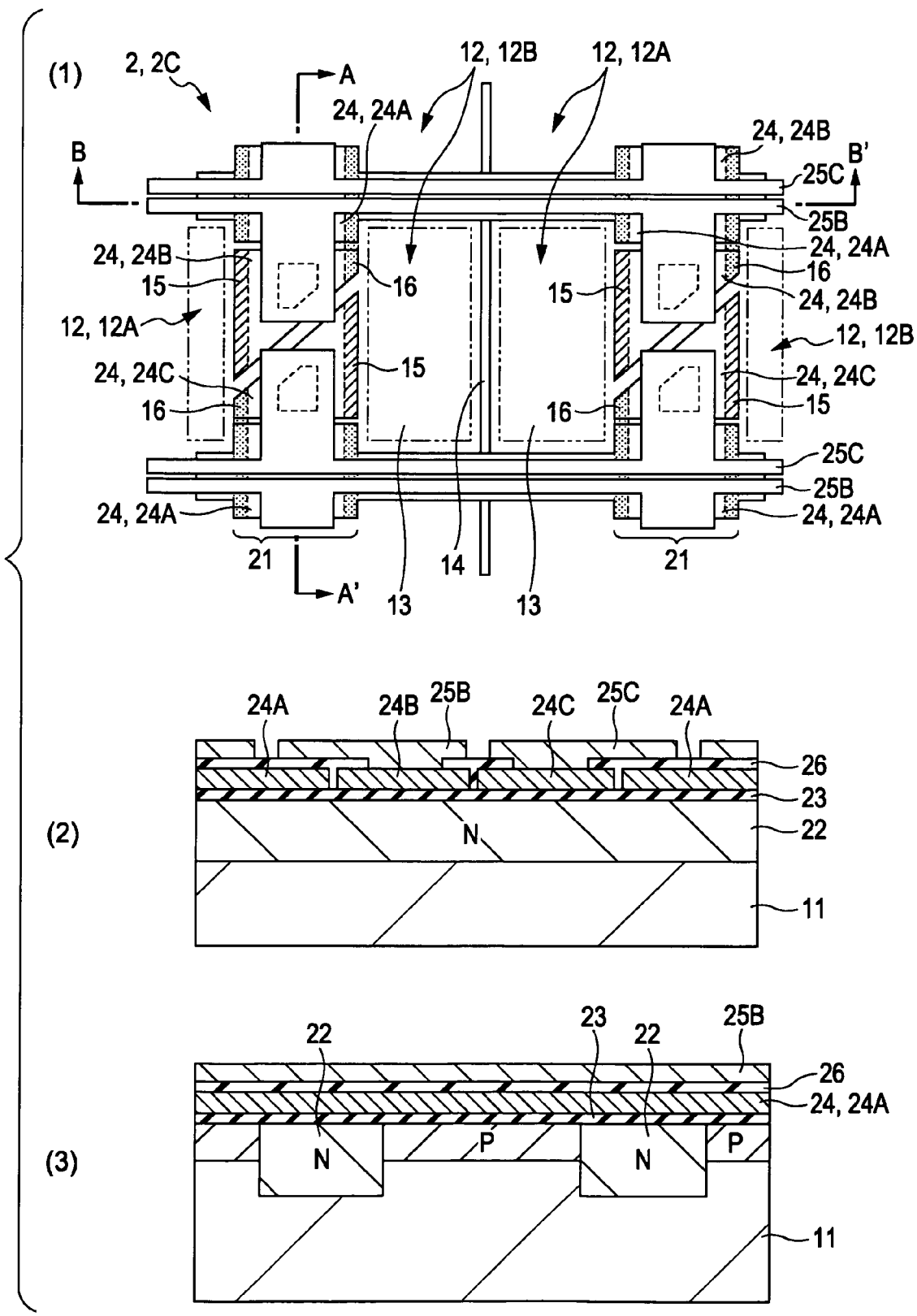
FIG. 7 is a diagram illustrating a seventh example of the configuration of the solid-state imaging device according to the second embodiment of the present invention, wherein (1) is a plan layout view, (2) is a cross-sectional view taken along line A-A', and (3) is a cross-sectional view taken along line B-B'.

As shown in FIG. 7, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are transfer electrodes having a 3-electrode structure per pixel, and are formed of, for example, first transfer electrodes 24A, second transfer electrodes 24B, and third transfer electrodes 24C. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B via an insulating layer 26. Each of the third transfer electrodes 24C in the horizontal transfer direction is connected onto pixels in the horizontal transfer direction by a wiring 25C via the insulating layer 26.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 and a second channel stop portion 16 formed in a direction parallel to the vertical transfer direction are formed between the two pixels 12 (12A and 12B) on both sides of the vertical CCD shift register 21.

One of the transfer electrodes having a 3-electrode structure, e.g., a portion of the third transfer electrodes 24C is formed protruding above the readout gate portion 15 via a readout gate insulating layer (not shown). That is to say, the third transfer electrode 24C thereof also serves as the readout electrode of the readout gate portion 15. Also, with pixels adjacent in the horizontal transfer direction, e.g., a portion of the second transfer electrodes 24B is formed in a protruding manner. That is to say, the second transfer electrode 24B thereof also serves as the readout electrode of the readout gate portion 15.

The readout gate portion 15 in the vertical transfer direction is formed longer than the second channel stop portion 16 in the vertical transfer direction thereof.

Also, for example, the readout electrodes formed in the third transfer electrodes 24C are formed in the horizontal transfer direction each pixel. Also, the readout electrodes formed in the second transfer electrodes 24B are formed with pixels wherein the readout electrodes formed in the first transfer electrodes 24A are not formed in the horizontal transfer direction. That is to say, the readout electrodes formed in the second transfer electrodes 24B are also formed in the horizontal transfer direction each pixel. Thus, a solid-state imaging device 2 (2C) is formed.

With the solid-state imaging device 2 (2C), the transfer electrodes 24 of the vertical CCD shift register 21 are transfer electrodes having a 3-electrode structure per pixel, and accordingly, readout voltage is not applied between pixels in the vertical transfer direction (e.g., between the pixels 12A and 12A, or between the pixels 12B and 12B). Therefore, an advantage is provided wherein occurrence of color mixture between pixels can be suppressed.

Moreover, the vertical CCD shift register 21 is shared by the two pixels 12 (12A and 12B) adjacent in the horizontal transfer direction, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

Also, the readout gate portion 15 in the same vertical transfer direction is formed longer than the second channel stop portion 16. Thus, of the second channel stop portion 16 side where readout is not executed, e.g., inverse readout from the photo sensor of the pixel 12A is prevented, and accordingly, readout from the photo sensor 13 of the pixel 12B can be executed smoothly.

Therefore, in order that the electrode length of the readout gate portion 15 side where the transfer electrodes 24 (third transfer electrodes 24C) are shared is longer than the electrode length of the second channel stop portion 16 side where the transfer electrodes 24 (third transfer electrodes 24C) are not shared, e.g., the facing surfaces between the second transfer electrodes 24B and the third transfer electrodes 24C are formed in an obliquely-cut shape on the plan layout.

8. Second Embodiment

Eighth Example of Configuration of Solid-State Imaging Device

Next, the second embodiment of the present invention (eighth example of the configuration of the solid-state imaging device) will be described with the plan layout view in (1) in FIG. 8, the cross-sectional view taken along line A-A' in (2) in FIG. 8, and the cross-sectional view taken along line B-B' in (3) in FIG. 8.

Figure 8:
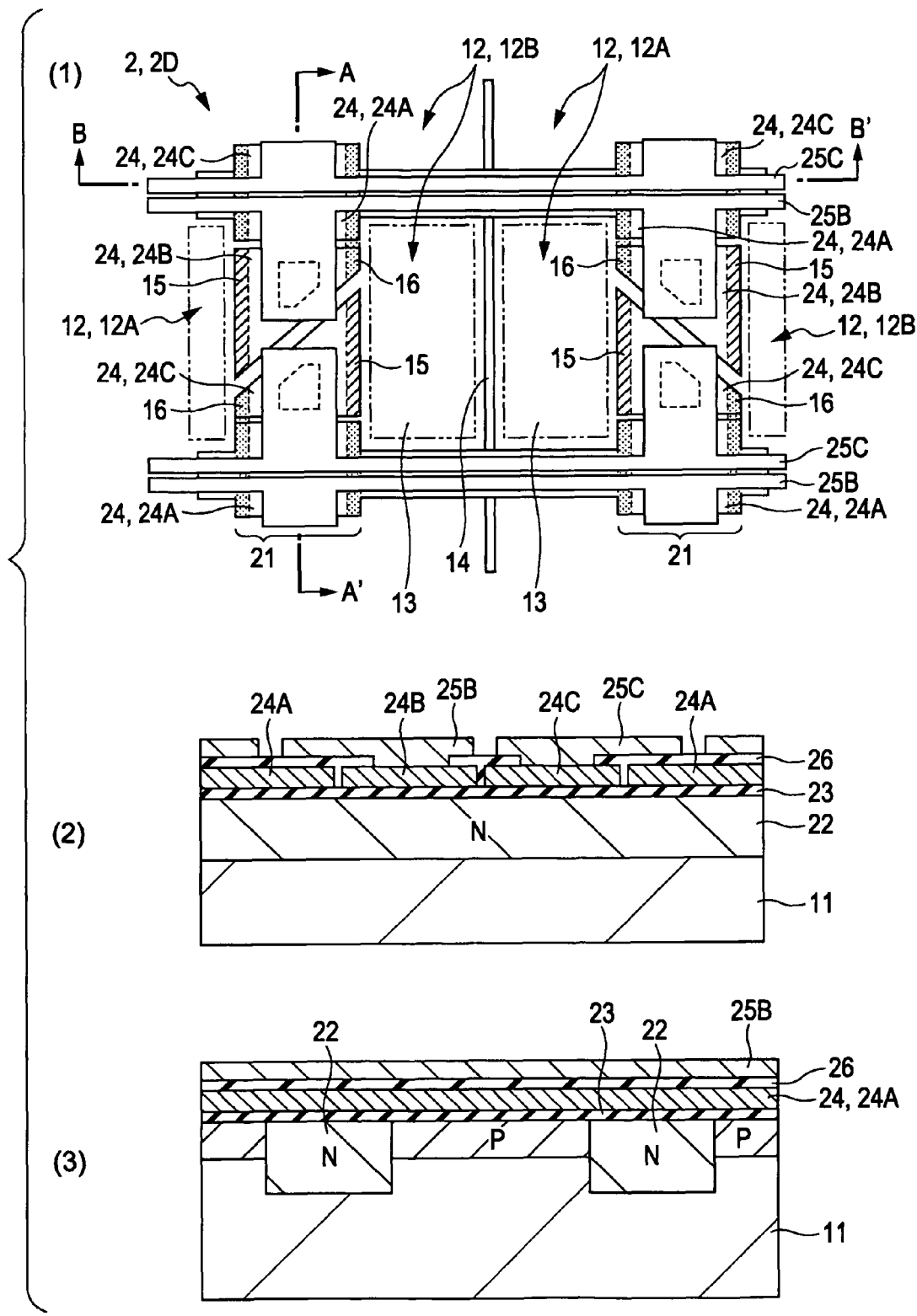
FIG. 8 is a diagram illustrating an eighth example of the configuration of the solid-state imaging device according to the second embodiment of the present invention, wherein (1)

As shown in FIG. 8, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are transfer electrodes having a 3-electrode structure per pixel, and are formed of, for example, first transfer electrodes 24A, second transfer electrodes 24B, and third transfer electrodes 24C. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B via an insulating layer 26. Each of the third transfer electrodes 24C in the horizontal transfer direction is connected onto pixels in the horizontal transfer direction by a wiring 25C via the insulating layer 26.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 and a second channel stop portion 16 formed in a direction parallel to the vertical transfer direction are formed between the two pixels 12 (12A and 12B) on both sides of the vertical CCD shift register 21.

One of the transfer electrodes having a 3-electrode structure, e.g., a portion of the third transfer electrodes 24C is formed protruding above the readout gate portion 15 via a readout gate insulating layer (not shown). That is to say, the third transfer electrode 24C thereof also serves as the readout electrode of the readout gate portion 15. Also, with pixels adjacent in the horizontal transfer direction, e.g., a portion of the second transfer electrodes 24B is formed in a protruding manner. That is to say, the second transfer electrode 24B thereof also serves as the readout electrode of the readout gate portion 15.

The readout gate portion 15 in the vertical transfer direction is formed longer than the second channel stop portion 16 in the vertical transfer direction thereof.

Also, for example, the readout electrodes formed in the third transfer electrodes 24C are formed in the horizontal transfer direction every two pixels. Also, the readout electrodes formed in the second transfer electrodes 24B are formed with pixels wherein the readout electrodes formed in the first transfer electrodes 24A are not formed in the horizontal transfer direction. That is to say, the readout electrodes formed in the second transfer electrodes 24B are also formed in the horizontal transfer direction every two pixels. Thus, a solid-state imaging device 2 (2D) is formed.

With the solid-state imaging device 2 (2D), the transfer electrodes 24 of the vertical CCD shift register 21 are transfer electrodes having a 3-electrode structure per pixel, and accordingly, readout voltage is not applied between pixels in the vertical transfer direction (e.g., between the pixels 12A and 12A, or between the pixels 12B and 12B). Therefore, an advantage is provided wherein occurrence of color mixture between pixels can be suppressed.

Moreover, the vertical CCD shift register 21 is shared by the two pixels 12 (12A and 12B) adjacent in the horizontal transfer direction, and accordingly, the sensor aperture can be increased an amount equivalent to that of the vertical CCD shift register 21 being shared, which provides an advantage in that sensitivity and the number of saturation signal electrons can be improved regardless of thinning of pixel size.

Also, the readout gate portion 15 in the same vertical transfer direction is formed longer than the second channel stop portion 16. Thus, of the second channel stop portion 16 side where readout is not executed, e.g., inverse readout from the photo sensor of the pixel 12A is prevented, and accordingly, readout from the photo sensor 13 of the pixel 12B can be executed smoothly.

Therefore, in order that the electrode length of the readout gate portion 15 side where the transfer electrodes 24 (third transfer electrodes 24C) are shared is longer than the electrode length of the second channel stop portion 16 side where the transfer electrodes 24 (third transfer electrodes 24C) are not shared, for example, the facing surfaces between the second transfer electrodes 24B and the third transfer electrodes 24C are formed in an obliquely-cut shape on the plan layout.

9. Third Embodiment

Ninth Example of Configuration of Solid-State Imaging Device

Next, a third embodiment of the present invention (ninth example of the configuration of the solid-state imaging device) will be described with the plan layout view in (1) in FIG. 9, the cross-sectional view taken along line A-A' in (2) in FIG. 9, and the cross-sectional view taken along line B-B' in (3) in FIG. 9.

As shown in FIG. 9, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. Each of the transfer electrodes 24 in the horizontal transfer direction is connected onto pixels in the horizontal transfer direction.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 is formed between the two pixels 12 (12A and 12B) on both sides of the vertical CCD shift register 21 in a direction parallel to the vertical transfer direction.

Readout electrodes 19 are formed above the readout gate portion 15 via a readout gate insulating layer (not shown), independent from the transfer electrodes 24 of the vertical CCD shift register 21. A portion of the readout electrodes 19 is formed above the transfer electrodes 24 via an insulating layer 26. The readout electrodes 19 are made up of first readout electrodes 19A and second readout electrodes 19B. That is to say, the first readout electrodes 19A are disposed on one side of the shared vertical CCD shift register 21, and the second readout electrodes 19B are disposed on the other side of the shared vertical CCD shift register 21, as to each of the pixels 12 arrayed in the horizontal transfer direction. Also, each of the first readout electrodes 19A is connected to a first readout wiring 31A disposed between the pixel rows of the pixels 12A adjacent in the vertical transfer direction, and between the pixel rows of the pixels 12B arrayed in the same horizontal transfer direction as the pixel rows of the pixels 12A. Each of the second readout electrodes 19B is connected to a second readout wiring 31B disposed between the pixel rows of the pixels 12A adjacent in the vertical transfer direction, and between the pixel rows of the pixels 12B arrayed in the same horizontal transfer direction as the pixel rows of the pixels 12A. Two wirings of the first readout wiring 31A and the second readout wiring 31B are disposed between the pixel rows of the pixels 12A adjacent in the vertical transfer direction, and between the pixel rows of the pixels 12B arrayed in the same horizontal transfer direction as the pixel rows of the pixels 12A. That is to say, the readout electrodes 19 are made up of the two wirings of the first readout wiring 31A and the second readout wiring 31B disposed between the pixels 12A and 12B in the vertical transfer direction.

The first readout wirings 31A and the second readout wirings 31B are connected alternately each pixel to the readout electrodes 19 of the pixels 12 arrayed in the horizontal transfer direction between the first readout wirings 31A and the second readout wirings 31B. Readout of the first readout wiring 31A, and readout of the second readout wiring 31B are executed alternately, thereby reading out all the pixels by two steps. Thus, a solid-state imaging device 3 (3A) is formed.

With the solid-state imaging device 3 (3A), the readout electrodes 19 are formed above the readout gate portion 15 via a readout gate insulating layer (not shown) independent from the transfer electrodes 24 of the vertical CCD shift register 21, and accordingly, even in the event that readout voltage is applied between the pixels 12 (12A) and 12 (12A) or between the pixels 12 (12B) and 12 (12B) in the vertical transfer direction, in between the pixels 12 (12A) and 12 (12A) or between the pixels 12 (12B) and 12 (12B) is not depleted. Thus, there is provided an advantage wherein occurrence of color mixture between pixels can be suppressed. Moreover, the two pixels 12 (12A and 12B) adjacent in the horizontal transfer direction share the vertical CCD shift register 21, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

10. Third Embodiment

Tenth Example of Configuration of Solid-State Imaging Device

Next, the third embodiment of the present invention (tenth example of the configuration of the solid-state imaging device) will be described with the plan layout view in (1) in FIG. 10, the cross-sectional view taken along line A-A' in (2) in FIG. 10, and the cross-sectional view taken along line B-B' in (3) in FIG. 10.

As shown in FIG. 10, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. Each of the transfer electrodes 24 in the horizontal transfer direction is connected onto pixels in the horizontal transfer direction.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 is formed between the two pixels 12 (12A and 12B) on both sides of the vertical CCD shift register 21 in a direction parallel to the vertical transfer direction.

Readout electrodes 19 are formed above the readout gate portion 15 via a readout gate insulating layer (not shown), independent from the transfer electrodes 24 of the vertical CCD shift register 21. A portion of the readout electrodes 19 is formed above the transfer electrodes 24 via an insulating layer 26. The readout electrodes 19 are made up of first readout electrodes 19A and second readout electrodes 19B. That is to say, the first readout electrodes 19A are disposed on one side of the shared vertical CCD shift register 21, and the second readout electrodes 19B are disposed on the other side of the shared vertical CCD shift register 21, as to each of the pixels 12 arrayed in the horizontal transfer direction. Also, each of the first readout electrodes 19A is connected to a first readout wiring 31A disposed between the pixel rows of the pixels 12A adjacent in the vertical transfer direction, and between the pixel rows of the pixels 12B arrayed in the same horizontal transfer direction as the pixel rows of the pixels 12A. Each of the second readout electrodes 19B is connected to a second readout wiring 31B disposed between the pixel rows of the pixels 12A adjacent in the vertical transfer direction, and between the pixel rows of the pixels 12B arrayed in the same horizontal transfer direction as the pixel rows of the pixels 12A. Two wirings of the first readout wiring 31A and the second readout wiring 31B are disposed between the pixel rows of the pixels 12A adjacent in the vertical transfer direction, and between the pixel rows of the pixels 12B arrayed in the same horizontal transfer direction as the pixel rows of the pixels 12A.

The first readout wirings 31A and the second readout wirings 31B are connected alternately every two pixels to the readout electrodes 19 of the pixels 12 arrayed in the horizontal transfer direction between the first readout wirings 31A and the second readout wirings 31B. Readout of the first readout wiring 31A, and readout of the second readout wiring 31B are executed alternately, thereby reading out all the pixels by two steps. Thus, a solid-state imaging device 3 (3B) is formed.

With the solid-state imaging device 3 (3B), the readout electrodes 19 are formed above the readout gate portion 15 via a readout gate insulating layer (not shown) independent from the transfer electrodes 24 of the vertical CCD shift register 21, and accordingly, even in the event that readout voltage is applied between the pixels 12 (12A) and 12 (12A) or between the pixels 12 (12B) and 12 (12B) in the vertical transfer direction, in between the pixels 12 (12A) and 12 (12A) or between the pixels 12 (12B) and 12 (12B) is not depleted. Thus, there is provided an advantage wherein occurrence of color mixture between pixels can be suppressed. Moreover, the two pixels 12 (12A and 12B) adjacent in the horizontal transfer direction share the vertical CCD shift register 21, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

11. Third Embodiment

Eleventh Example of Configuration of Solid-State Imaging Device

Next, the third embodiment of the present invention (eleventh example of the configuration of the solid-state imaging device) will be described with the plan layout view in (1) in FIG. 11, the cross-sectional view taken along line A-A' in (2) in FIG. 11, and the cross-sectional view taken along line B-B' in (3) in FIG. 11.

As shown in FIG. 11, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are made up of, for example, first transfer electrodes 24A and second transfer electrodes 24B. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 is formed between the two pixels 12 (12A and 12B) on both sides of the vertical CCD shift register 21 in a direction parallel to the vertical transfer direction.

Readout electrodes 19 are formed above the readout gate portion 15 via a readout gate insulating layer (not shown), independent from the transfer electrodes 24 of the vertical CCD shift register 21. A portion of the readout electrodes 19 is formed above the transfer electrodes 24 via an insulating layer 26. The readout electrodes 19 are made up of first readout electrodes 19A and second readout electrodes 19B. That is to say, the first readout electrodes 19A are disposed on one side (e.g., pixel 12A side) of the first transfer electrodes 24A of the shared vertical CCD shift register 21, as to each of the pixels 12 arrayed in the horizontal transfer direction. Also, the second readout electrodes 19B are disposed on the other side (e.g., pixel 12B side) of the second transfer electrodes 24B of the shared vertical CCD shift register 21. Also, each of the first readout electrodes 19A is connected to a first readout wiring 31A disposed between the pixel rows of the pixels 12A adjacent in the vertical transfer direction, and between the pixel rows of the pixels 12B arrayed in the same horizontal transfer direction as the pixel rows of the pixels 12A. Each of the second readout electrodes 19B is connected to a second readout wiring 31B disposed between the pixel rows of the pixels 12A adjacent in the vertical transfer direction, and between the pixel rows of the pixels 12B arrayed in the same horizontal transfer direction as the pixel rows of the pixels 12A. Two wirings of the first readout wiring 31A and the second readout wiring 31B are disposed between the pixel rows of the pixels 12A adjacent in the vertical transfer direction, and between the pixel rows of the pixels 12B arrayed in the same horizontal transfer direction as the pixel rows of the pixels 12A.

The first readout wirings 31A and the second readout wirings 31B are connected alternately to the readout electrodes 19 of the pixels 12 arrayed in the horizontal transfer direction between the first readout wirings 31A and the second readout wirings 31B each pixel. Readout of the first readout wiring 31A, and readout of the second readout wiring 31B are executed alternately, thereby reading out all the pixels by two steps. Thus, a solid-state imaging device 3 (3C) is formed.

With the solid-state imaging device 3 (3C), the readout electrodes 19 are formed above the readout gate portion 15 via a readout gate insulating layer (not shown) independent from the transfer electrodes 24 of the vertical CCD shift register 21, and accordingly, even in the event that readout voltage is applied between the pixels 12 (12A) and 12 (12A) or between the pixels 12 (12B) and 12 (12B) in the vertical transfer direction, in between the pixels 12 (12A) and 12 (12A) or between the pixels 12 (12B) and 12 (12B) is not depleted. Thus, there is provided an advantage wherein occurrence of color mixture between pixels can be suppressed. Moreover, the two pixels 12 (12A and 12B) adjacent in the horizontal transfer direction share the vertical CCD shift register 21, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

12. Third Embodiment

Twelfth Example of Configuration of Solid-State Imaging Device

Next, the third embodiment of the present invention (twelfth example of the configuration of the solid-state imaging device) will be described with the plan layout view in (1) in FIG. 12, the cross-sectional view taken along line A-A' in (2) in FIG. 12, and the cross-sectional view taken along line B-B' in (3) in FIG. 12.

As shown in FIG. 12, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are made up of, for example, first transfer electrodes 24A and second transfer electrodes 24B. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 is formed between the two pixels 12 (12A and 12B) on both sides of the vertical CCD shift register 21 in a direction parallel to the vertical transfer direction.

Readout electrodes 19 are formed above the readout gate portion 15 via a readout gate insulating layer (not shown), independent from the transfer electrodes 24 of the vertical CCD shift register 21. A portion of the readout electrodes 19 is formed above the transfer electrodes 24 via an insulating layer 26. The readout electrodes 19 are made up of first readout electrodes 19A and second readout electrodes 19B. That is to say, the first readout electrodes 19A are disposed on one side (e.g., pixel 12A side) of the first transfer electrodes 24A of the shared vertical CCD shift register 21, as to each of the pixels 12 arrayed in the horizontal transfer direction. Also, the second readout electrodes 19B are disposed on the other side (e.g., pixel 12B side) of the second transfer electrodes 24B of the shared vertical CCD shift register 21. Also, each of the first readout electrodes 19A is connected to a first readout wiring 31A disposed between the pixel rows of the pixels 12A adjacent in the vertical transfer direction, and between the pixel rows of the pixels 12B arrayed in the same horizontal transfer direction as the pixel rows of the pixels 12A. Each of the second readout electrodes 19B is connected to a second readout wiring 31B disposed between the pixel rows of the pixels 12A adjacent in the vertical transfer direction, and between the pixel rows of the pixels 12B arrayed in the same horizontal transfer direction as the pixel rows of the pixels 12A. Two wirings of the first readout wiring 31A and the second readout wiring 31B are disposed between the pixel rows of the pixels 12A adjacent in the vertical transfer direction, and between the pixel rows of the pixels 12B arrayed in the same horizontal transfer direction as the pixel rows of the pixels 12A.

The first readout wirings 31A and the second readout wirings 31B are connected alternately to the readout electrodes 19 of the pixels 12 arrayed in the horizontal transfer direction between the first readout wirings 31A and the second readout wirings 31B ever two pixels. Readout of the first readout wiring 31A, and readout of the second readout wiring 31B are executed alternately, thereby reading out all the pixels by two steps. Thus, a solid-state imaging device 3 (3D) is formed.

With the solid-state imaging device 3 (3D), the readout electrodes 19 are formed above the readout gate portion 15 via a readout gate insulating layer (not shown) independent from the transfer electrodes 24 of the vertical CCD shift register 21, and accordingly, even in the event that readout voltage is applied between the pixels 12 (12A) and 12 (12A) or between the pixels 12 (12B) and 12 (12B) in the vertical transfer direction, in between the pixels 12 (12A) and 12 (12A) or between the pixels 12 (12B) and 12 (12B) is not depleted. Thus, there is provided an advantage wherein occurrence of color mixture between pixels can be suppressed. Moreover, the two pixels 12 (12A and 12B) adjacent in the horizontal transfer direction share the vertical CCD shift register 21, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

13. Third Embodiment

Thirteenth Example of Configuration of Solid-State Imaging Device

Next, the third embodiment of the present invention (thirteenth example of the configuration of the solid-state imaging device) will be described with the plan layout view in (1) in FIG. 13, the cross-sectional view taken along line A-A' in (2) in FIG. 13, and the cross-sectional view taken along line B-B' in (3) in FIG. 13.

As shown in FIG. 13, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are made up of, for example, first transfer electrodes 24A and second transfer electrodes 24B. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 is formed between the two pixels 12 (12A and 12B) on both sides of the vertical CCD shift register 21 in a direction parallel to the vertical transfer direction.

Readout electrodes 19 are formed above the readout gate portion 15 via a readout gate insulating layer (not shown), independent from the transfer electrodes 24 of the vertical CCD shift register 21. A portion of the readout electrodes 19 is formed above the transfer electrodes 24 via an insulating layer 26. The readout electrodes 19 are made up of first readout electrodes 19A and second readout electrodes 19B. That is to say, the first readout electrodes 19A are formed on one side (e.g., pixel 12A side) of the first transfer electrodes 24A of the shared vertical CCD shift register 21 via an insulating layer 26, as to each of the pixels 12 arrayed in the horizontal transfer direction, and further, are formed above the readout gate portion 15 in an extended manner via a readout gate insulating layer (not shown).

Also, the second readout electrodes 19B are formed above the readout gate portion 15 on the other side (e.g., pixel 12B side) of the second transfer electrodes 24B of the shared vertical CCD shift register 21 in an extended manner via the gate insulating layer 23, as to each of the pixels 12 arrayed in the horizontal transfer direction.

A readout wiring 30 is disposed between the pixels 12A and 12B in the vertical transfer direction. With the readout wiring 31A, the first readout electrodes 19A are connected to one side in the vertical transfer direction, and the second readout electrodes 19B are connected to the other side in the vertical transfer direction. That is to say, the first readout electrodes 19A and the second readout electrodes 19B are formed in a facing state across the readout wiring 30.

The readout wiring 30 (30A) on one side across the pixels 12 arrayed in the horizontal transfer direction is connected to the first readout electrodes 19A each pixel. Also, the readout wiring 30 (30B) on the other side is connected to the second readout electrodes 19B each pixel.

Readout of the readout wiring 30 (30A), and readout of the readout wiring 30 (30B) are executed alternately, whereby all the pixels are read out by two steps. Thus, a solid-state imaging device 3 (3E) is formed.

With the solid-state imaging device 3 (3E), the readout electrodes 19 are formed above the readout gate portion 15 via a readout gate insulating layer (not shown) independent from the transfer electrodes 24 of the vertical CCD shift register 21, and accordingly, even in the event that readout voltage is applied between the pixels 12 (12A and 12B) in the vertical transfer direction, in between the pixels 12 (12A and 12B) is not depleted. Thus, there is provided an advantage wherein occurrence of color mixture between pixels can be suppressed. Moreover, the two pixels 12 (12A and 12B) adjacent in the horizontal transfer direction share the vertical CCD shift register 21, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

14. Third Embodiment

Fourteenth Example of Configuration of Solid-State Imaging Device

Next, the third embodiment of the present invention (fourteenth example of the configuration of the solid-state imaging device) will be described with the plan layout view in (1) in FIG. 14, the cross-sectional view taken along line A-A' in (2) in FIG. 14, and the cross-sectional view taken along line B-B' in (3) in FIG. 14.

As shown in FIG. 14, with a semiconductor substrate 11, multiple pixels 12 are arrayed in the vertical transfer direction and in the horizontal transfer direction. Also, with the semiconductor substrate 11, a vertical CCD shift register 21 is formed. The vertical CCD shift register 21 is made up of a charge transfer portion 22 made up of an N-type region formed on a semiconductor substrate, and multiple transfer electrodes 24 arrayed in the vertical transfer direction, formed on the upper face thereof via a gate insulating layer 23. The transfer electrodes 24 are made up of, for example, first transfer electrodes 24A and second transfer electrodes 24B. Each of the first transfer electrodes 24A in the horizontal transfer direction is connected onto pixels in the horizontal transfer direction. Each of the second transfer electrodes 24B in the horizontal transfer direction is connected onto pixels in the horizontal transfer direction by a wiring 25B.

Two pixels adjacent in the horizontal transfer direction which share the vertical CCD shift register 21, e.g., pixels 12 (12A and 12B) are disposed. That is to say, the two pixels 12 (12A and 12B) share the vertical CCD shift register 21. With each pixel 12, a photo sensor 13 which subjects incident light to photoelectric conversion to obtain signal charge is formed.

Also, a first channel stop portion 14 for separation between pixels is formed between the two pixels 12 (12A and 12B), and pixels 12 adjacent to the two pixels in the horizontal transfer direction. Accordingly, the first channel stop portion 14 is disposed between the two pixels 12 (12A and 12B), and other two pixels 12 (12A and 12B) adjacent thereto.

A readout gate portion 15 is formed between the two pixels 12 (12A and 12B) on both sides of the vertical CCD shift register 21 in a direction parallel to the vertical transfer direction.

Readout electrodes 19 are formed above the readout gate portion 15 via a readout gate insulating layer (not shown), independent from the transfer electrodes 24 of the vertical CCD shift register 21. A portion of the readout electrodes 19 is formed above the transfer electrodes 24 via an insulating layer 26.

The readout electrodes 19 are made up of first readout electrodes 19A and second readout electrodes 19B. That is to say, the first readout electrodes 19A are formed on one side (e.g., pixel 12A side) of the first transfer electrodes 24A of the shared vertical CCD shift register 21 via an insulating layer 26, as to each of the pixels 12 arrayed in the horizontal transfer direction, and further, are formed above the readout gate portion 15 in an extended manner via a readout gate insulating layer (not shown).

Also, the second readout electrodes 19B are formed above the readout gate portion 15 on the other side (e.g., pixel 12B side) of the second transfer electrodes 24B of the shared vertical CCD shift register 21 in an extended manner via the above readout gate insulating layer (not shown), as to each of the pixels 12 arrayed in the horizontal transfer direction.

Also, a readout wiring 30 is disposed between the pixel rows of the pixels 12A adjacent in the vertical transfer direction, and between the pixel rows of the pixels 12B arrayed in the same horizontal transfer direction as the pixel rows of the pixels 12A. With the readout wiring 31A, the first readout electrodes 19A are connected to one side in the vertical transfer direction, and the second readout electrodes 19B are connected to the other side in the vertical transfer direction. That is to say, the first readout electrodes 19A and the second readout electrodes 19B are formed in a facing state across the readout wiring 30.

The readout wiring 30 (30A) on one side across the pixels 12 arrayed in the horizontal transfer direction is connected to the first readout electrodes 19A every two pixels. Also, the readout wiring 30 (30B) on the other side is connected to the second readout electrodes 19B every two pixels.

Readout of the readout wiring 30 (30A), and readout of the readout wiring 30 (30B) are executed alternately, whereby all the pixels are read out by two steps. Thus, a solid-state imaging device 3 (3F) is formed.

With the solid-state imaging device 3 (3F), the readout electrodes 19 are formed above the readout gate portion 15 via a readout gate insulating layer (not shown) independent from the transfer electrodes 24 of the vertical CCD shift register 21, and accordingly, even in the event that readout voltage is applied between the pixels 12 (12A) and 12 (12A) or between the pixels 12 (12B) and 12 (12B) in the vertical transfer direction, in between the pixels 12 (12A) and 12 (12A) or between the pixels 12 (12B) and 12 (12B) is not depleted. Thus, there is provided an advantage wherein occurrence of color mixture between pixels can be suppressed. Moreover, the two pixels 12 (12A and 12B) adjacent in the horizontal transfer direction share the vertical CCD shift register 21, and accordingly, the sensor aperture can be increased by an amount equivalent to that of the vertical CCD shift register 21 being shared, which provides an advantage in that sensitivity and the number of saturation signal electrons can be improved regardless of thinning of pixel size.

15. Fourth Embodiment

First Example of Readout Method for Solid-State Imaging Device

A fourth embodiment of the present invention (first example of a readout method for a solid-state imaging device) will be described with the plan layout view of FIG. 15. Note that arrows in the drawing represent "readout" of signal charge from a photo sensor 13 to a vertical CCD shift register.

As shown in FIG. 15, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A.

The readout wirings 31 are made up of two wirings of a first readout wiring 31A and a second readout wiring 31B, disposed between the pixels in the vertical transfer direction. The first readout wirings 31A and the second readout wirings 31B are connected alternately to the readout electrode (not shown) formed at each of the pixels 12 arrayed in the horizontal transfer direction between the first readout wirings 31A and the second readout wirings 31B.

With the present example, the first readout wirings 31A and the second readout wirings 31B are connected alternately each pixel in the horizontal transfer direction.

The above solid-state imaging device described with reference to FIG. 1, 3, 5, 7, 9, or 11 may be used as the solid-state imaging device having the above configuration.

With the solid-state imaging device having the above configuration, readout of the first readout wirings 31A, and readout of the second readout wirings 31B are executed alternately, whereby all the pixels can be readout by two steps. With the present example, readout of the first readout wirings 31A makes up one system, and readout of the second readout wirings 31B makes up one system.

16. Fourth Embodiment

Second Example of Readout Method for Solid-State Imaging Device

Next, the fourth embodiment of the present invention (second example of the readout method for the solid-state imaging device) will be described with the plan layout view of FIG. 16. Note that arrows in the drawing represent "readout" of signal charge from a photo sensor 13 to a vertical CCD shift register.

As shown in FIG. 16, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A.

The readout wirings 31 are made up of two wirings of a first readout wiring 31A and a second readout wiring 31B, disposed between the pixels in the vertical transfer direction. The first readout wirings 31A and the second readout wirings 31B are connected alternately to the readout electrode (not shown) formed at each of the pixels 12 arrayed in the horizontal transfer direction between the first readout wirings 31A and the second readout wirings 31B.

With the present example, the first readout wirings 31A and the second readout wirings 31B are connected alternately each pixel in the horizontal transfer direction.

The first readout wirings 31A are connected to a first readout system 32A each wiring in the vertical transfer direction, and the remaining first readout wirings 31A are connected to a second readout system 32B each wiring in the vertical transfer direction. That is to say, the first readout wirings 31A wherein multiple wirings are disposed in the vertical transfer direction are connected to the first readout system 32A and the second readout system 32B alternately.

Also, the second readout wirings 31B are connected to a first readout system 33A each wiring in the vertical transfer direction, and the remaining second readout wirings 31B are connected to a second readout system 33B each wiring in the vertical transfer direction. That is to say, the second readout wirings 31B wherein multiple wirings are disposed in the vertical transfer direction are connected to the first readout system 33A and the second readout system 33B alternately.

With the solid-state imaging device having the above wiring configuration, the first readout system 32A, the second readout system 33A, the first readout system 32B, and the second readout system 33B are driven in order, thereby realizing four-phase driving (four field readout).

The above solid-state imaging device described with reference to FIG. 1, 3, 5, 7, 9, or 11 may be used as the solid-state imaging device having the above configuration.

Readout of the first readout wirings 31A, and readout of the second readout wirings 31B are executed alternately, whereby all the pixels can be readout by two steps.

17. Fourth Embodiment

Third Example of Readout Method for Solid-State Imaging Device

The fourth embodiment of the present invention (third example of the readout method for the solid-state imaging device) will be described with the plan layout view of FIG. 17. Note that arrows in the drawing represent "readout" of signal charge from a photo sensor 13 to a vertical CCD shift register.

As shown in FIG. 17, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A.

The readout wirings 31 are made up of two wirings of a first readout wiring 31A and a second readout wiring 31B, disposed between the pixels in the vertical transfer direction. The first readout wirings 31A and the second readout wirings 31B are connected alternately to the readout electrode (not shown) formed at each of the pixels 12 arrayed in the horizontal transfer direction between the first readout wirings 31A and the second readout wirings 31B.

With the present example, the first readout wirings 31A and the second readout wirings 31B are connected alternately each pixel in the horizontal transfer direction.

In the order in which the first readout wirings 31A are disposed in the vertical transfer direction, the first readout wirings 31A are connected to the first readout system 32A, first readout system 32B, and first readout system 32C sequentially, and connection thereof is repeated.

Also, in the order in which the second readout wirings 31B are disposed in the vertical transfer direction, the second readout wirings 31B are connected to the second readout system 33A, second readout system 33B, and second readout system 33C sequentially, and connection thereof is repeated.

With the solid-state imaging device having the above wiring configuration, the first readout system 32A, the second readout system 33A, the first readout system 32B, the second readout system 33B, the first readout system 32C, and the second readout system 33C, are driven in order, thereby realizing six-phase driving (six field readout).

The above solid-state imaging device described with reference to FIG. 1, 3, 5, 7, 9, or 11 may be used as the solid-state imaging device having the above configuration.

Readout of the first readout wirings 31A, and readout of the second readout wirings 31B are executed alternately, whereby all the pixels can be readout by two steps.

18. Fourth Embodiment

Fourth Example of Readout Method for Solid-State Imaging Device

The fourth embodiment of the present invention (fourth example of the readout method for the solid-state imaging device) will be described with the plan layout view of FIG. 18. Note that arrows in the drawing represent "readout" of signal charge from a photo sensor 13 to a vertical CCD shift register.

As shown in FIG. 18, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A.

The readout wirings 31 are made up of two wirings of a first readout wiring 31A and a second readout wiring 31B, disposed between the pixels in the vertical transfer direction. The first readout wirings 31A and the second readout wirings 31B are connected alternately to the readout electrode (not shown) formed at each of the pixels 12 arrayed in the horizontal transfer direction between the first readout wirings 31A and the second readout wirings 31B. With the present example, the first readout wirings 31A and the second readout wirings 31B are connected alternately every two pixels in the horizontal transfer direction.

The above solid-state imaging device described with reference to FIG. 2, 4, 6, 8, 10, or 12 may be used as the solid-state imaging device having the above configuration.

With the solid-state imaging device having the above configuration, readout of the first readout wirings 31A, and readout of the second readout wirings 31B are executed alternately, whereby all the pixels can be readout by two steps.

With the present example, readout of the first readout wirings 31A makes up one system, and readout of the second readout wirings 31B makes up one system.

19. Fourth Embodiment

Fifth Example of Readout Method for Solid-State Imaging Device

Next, the fourth embodiment of the present invention (fifth example of the readout method for the solid-state imaging device) will be described with the plan layout view of FIG. 19. Note that arrows in the drawing represent "readout" of signal charge from a photo sensor 13 to a vertical CCD shift register.

As shown in FIG. 19, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A. The readout wirings 31 are made up of two wirings of a first readout wiring 31A and a second readout wiring 31B, disposed between the pixels in the vertical transfer direction.

The first readout wirings 31A and the second readout wirings 31B are connected alternately to the readout electrode (not shown) formed at each of the pixels 12 arrayed in the horizontal transfer direction between the first readout wirings 31A and the second readout wirings 31B.

With the present example, the first readout wirings 31A and the second readout wirings 31B are connected alternately every two pixels in the horizontal transfer direction.

The first readout wirings 31A are connected to a first readout system 32A each wiring in the vertical transfer direction, and the remaining first readout wirings 31A are connected to a second readout system 32B each wiring in the vertical transfer direction. That is to say, the first readout wirings 31A of which the multiple wirings are disposed in the vertical transfer direction are connected to the first readout system 32A and the second readout system 32B alternately.

Also, the second readout wirings 31B are connected to a first readout system 33A each wiring in the vertical transfer direction, and the remaining second readout wirings 31B are connected to a second readout system 33B each wiring in the vertical transfer direction. That is to say, the second readout wirings 31B of which the multiple wirings are disposed in the vertical transfer direction are connected to the first readout system 33A and the second readout system 33B alternately.

With the solid-state imaging device having the above wiring configuration, the first readout system 32A, the second readout system 33A, the first readout system 32B, and the second readout system 33B are driven in order, thereby realizing four-phase driving (four field readout).

The above solid-state imaging device described with reference to FIG. 2, 4, 6, 8, 10, or 12 may be used as the solid-state imaging device having the above configuration.

Readout of the first readout wirings 31A, and readout of the second readout wirings 31B are executed alternately, whereby all the pixels can be readout by two steps.

20. Fourth Embodiment

Sixth Example of Readout Method for Solid-State Imaging Device

The fourth embodiment of the present invention (sixth example of the readout method for the solid-state imaging device) will be described with the plan layout view of FIG. 20. Note that arrows in the drawing represent "readout" of signal charge from a photo sensor 13 to a vertical CCD shift register.

As shown in FIG. 20, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A.

The readout wirings 31 are made up of two wirings of a first readout wiring 31A and a second readout wiring 31B, disposed between the pixels in the vertical transfer direction. The first readout wirings 31A and the second readout wirings 31B are connected alternately to the readout electrode (not shown) formed at each of the pixels 12 arrayed in the horizontal transfer direction between the first readout wirings 31A and the second readout wirings 31B. With the present example, the first readout wirings 31A and the second readout wirings 31B are connected alternately every two pixels in the horizontal transfer direction.

In the order in which the first readout wirings 31A are disposed in the vertical transfer direction, the first readout wirings 31A are connected to the first readout system 32A, first readout system 32B, and first readout system 32C sequentially, and connection thereof is repeated.

Also, in the order in which the second readout wirings 31B are disposed in the vertical transfer direction, the second readout wirings 31B are connected to the second readout system 33A, second readout system 33B, and second readout system 33C sequentially, and connection thereof is repeated.

With the solid-state imaging device having the above wiring configuration, the first readout system 32A, the second readout system 33A, the first readout system 32B, the second readout system 33B, the first readout system 32C, and the second readout system 33C, are driven in order, thereby realizing six-phase driving (six field readout).

The above solid-state imaging device described with reference to FIG. 2, 4, 6, 8, 10, or 12 may be used as the solid-state imaging device having the above configuration.

Readout of the first readout wirings 31A, and readout of the second readout wirings 31B are executed alternately, whereby all the pixels can be readout by two steps.

21. Fifth Embodiment

Seventh Example of Readout Method for Solid-State Imaging Device

A fifth embodiment of the present invention (seventh example of a readout method for a solid-state imaging device) will be described with the plan layout view of FIG. 21. Note that arrows in the drawing represent "readout" of signal charge from a photo sensor 13 to a vertical CCD shift register.

As shown in FIG. 21, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A.

The readout wirings 31 are made up of first readout wirings 31A and second readout wirings 31B, alternately disposed each wiring between the pixels in the vertical transfer direction.

The first readout wirings 31A are connected alternately to the readout electrode (not shown) formed at the pixels 12 (12A and 12B) across the first readout wirings 31A in the vertical transfer direction.

The second readout wirings 31B are connected to the readout electrode (not shown) formed at pixels not connected to the first readout wirings 31A, of the pixels 12 (12A and 12B) across the second readout wirings 31B in the vertical transfer direction.

With the present example, the first readout wirings 31A and the second readout wirings 31B are connected alternately each pixel in the horizontal transfer direction.

The solid-state imaging device described with reference to FIG. 13 may be used as the solid-state imaging device having the above configuration.

With the solid-state imaging device having the above configuration, readout of the first readout wirings 31A, and readout of the second readout wirings 31B are executed alternately, whereby all the pixels can be readout by two steps.

With the present example, readout of the first readout wirings 31A makes up one system, and readout of the second readout wirings 31B makes up one system.

22. Fifth Embodiment

Eighth Example of Readout Method for Solid-State Imaging Device

The fifth embodiment of the present invention (eighth example of the readout method for the solid-state imaging device) will be described with the plan layout view of FIG. 22. Note that arrows in the drawing represent "readout" of signal charge from a photo sensor 13 to a vertical CCD shift register.

As shown in FIG. 22, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A.

The readout wirings 31 are made up of first readout wirings 31A and second readout wirings 31B, alternately disposed each wiring between the pixels in the vertical transfer direction.

The first readout wirings 31A are connected alternately to the readout electrode (not shown) formed at the pixels 12 (12A and 12B) across the first readout wirings 31A in the vertical transfer direction.

The second readout wirings 31B are connected to the readout electrode (not shown) formed at pixels not connected to the first readout wirings 31A, of the pixels 12 (12A and 12B) across the second readout wirings 31B in the vertical transfer direction.

With the present example, the first readout wirings 31A and the second readout wirings 31B are connected alternately each pixel in the horizontal transfer direction.

The first readout wirings 31A of which the multiple wirings are disposed in the vertical transfer direction are connected to a first readout system 32A each wiring in the vertical transfer direction, and the remaining first readout wirings 31A are connected to a second readout system 32B each wiring in the vertical transfer direction. That is to say, the first readout wirings 31A of which the multiple wirings are disposed in the vertical transfer direction are connected to the first readout system 32A and the second readout system 32B alternately.

Also, the second readout wirings 31B are connected to a first readout system 33A each wiring in the vertical transfer direction, and the remaining second readout wirings 31B are connected to a second readout system 33B each wiring in the vertical transfer direction. That is to say, the second readout wirings 31B of which the multiple wirings are disposed in the vertical transfer direction are connected to the first readout system 33A and the second readout system 33B alternately.

With the solid-state imaging device having the above wiring configuration, the first readout system 32A, the second readout system 33A, the first readout system 32B, and the second readout system 33B are driven in order, thereby realizing four-phase driving (four field readout).

The solid-state imaging device described with reference to FIG. 13 may be used as the solid-state imaging device having the above configuration.

With the solid-state imaging device having the above configuration, readout of the first readout wirings 31A, and readout of the second readout wirings 31B are executed alternately, whereby all the pixels can be readout by two steps.

23. Fifth Embodiment

Ninth Example of Readout Method for Solid-State Imaging Device

The fifth embodiment of the present invention (ninth example of the readout method for the solid-state imaging device) will be described with the plan layout view of FIG. 23. Note that arrows in the drawing represent "readout" of signal charge from a photo sensor 13 to a vertical CCD shift register.

As shown in FIG. 23, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A.

The readout wirings 31 are made up of first readout wirings 31A and second readout wirings 31B, alternately disposed each wiring between the pixels in the vertical transfer direction.

The first readout wirings 31A are connected alternately to the readout electrode (not shown) formed at the pixels 12 (12A and 12B) across the first readout wirings 31A in the vertical transfer direction.

The second readout wirings 31B are connected to the readout electrode (not shown) formed at pixels not connected to the first readout wirings 31A, of the pixels 12 (12A and 12B) across the second readout wirings 31B in the vertical transfer direction.

With the present example, the first readout wirings 31A and the second readout wirings 31B are connected alternately each pixel in the horizontal transfer direction.

In the order in which the first readout wirings 31A are disposed in the vertical transfer direction, the first readout wirings 31A are connected to the first readout system 32A, first readout system 32B, and first readout system 32C sequentially, and connection thereof is repeated.

Also, in the order in which the second readout wirings 31B are disposed in the vertical transfer direction, the second readout wirings 31B are connected to the second readout system 33A, second readout system 33B, and second readout system 33C sequentially, and connection thereof is repeated.

With the solid-state imaging device having the above wiring configuration, the first readout system 32A, the second readout system 33A, the first readout system 32B, the second readout system 33B, the first readout system 32C, and the second readout system 33C, are driven in order, thereby realizing six-phase driving (six field readout).

The solid-state imaging device described with reference to FIG. 13 may be used as the solid-state imaging device having the above configuration.

With the solid-state imaging device having the above configuration, readout of the first readout wirings 31A, and readout of the second readout wirings 31B are executed alternately, whereby all the pixels can be readout by two steps.

24. Fifth Embodiment

Tenth Example of Readout Method for Solid-State Imaging Device

The fifth embodiment of the present invention (tenth example of the readout method for the solid-state imaging device) will be described with the plan layout view of FIG. 24. Note that arrows in the drawing represent "readout" of signal charge from a photo sensor 13 to a vertical CCD shift register.

As shown in FIG. 24, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A.

The readout wirings 31 are made up of first readout wirings 31A and second readout wirings 31B, alternately disposed each wiring between the pixels in the vertical transfer direction.

The first readout wirings 31A are connected alternately to the readout electrode (not shown) formed at the pixels 12 (12A and 12B) across the first readout wirings 31A in the vertical transfer direction.

The second readout wirings 31B are connected to the readout electrode (not shown) formed at pixels not connected to the first readout wirings 31A, of the pixels 12 (12A and 12B) across the second readout wirings 31B in the vertical transfer direction.

With the present example, the first readout wirings 31A and the second readout wirings 31B are connected alternately every two pixels in the horizontal transfer direction.

The solid-state imaging device described with reference to FIG. 14 may be used as the solid-state imaging device having the above configuration.

With the solid-state imaging device having the above configuration, readout of the first readout wirings 31A, and readout of the second readout wirings 31B are executed alternately, whereby all the pixels can be readout by two steps.

With the present example, readout of the first readout wirings 31A makes up one system, and readout of the second readout wirings 31B makes up one system.

25. Fifth Embodiment

Eleventh Example of Readout Method for Solid-State Imaging Device

The fifth embodiment of the present invention (eleventh example of the readout method for the solid-state imaging device) will be described with the plan layout view of FIG. 25. Note that arrows in the drawing represent "readout" of signal charge from a photo sensor 13 to a vertical CCD shift register.

As shown in FIG. 25, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A.

The readout wirings 31 are made up of first readout wirings 31A and second readout wirings 31B, alternately disposed each wiring between the pixels in the vertical transfer direction.

The first readout wirings 31A are connected alternately to the readout electrode (not shown) formed at the pixels 12 (12A and 12B) across the first readout wirings 31A in the vertical transfer direction.

The second readout wirings 31B are connected to the readout electrode (not shown) formed at pixels not connected to the first readout wirings 31A, of the pixels 12 (12A and 12B) across the second readout wirings 31B in the vertical transfer direction.

With the present example, the first readout wirings 31A and the second readout wirings 31B are connected alternately every two pixels in the horizontal transfer direction.

The first readout wirings 31A of which the multiple wirings are disposed in the vertical transfer direction are connected to a first readout system 32A each wiring in the vertical transfer direction, and the remaining first readout wirings 31A are connected to a second readout system 32B each wiring in the vertical transfer direction. That is to say, the first readout wirings 31A of which the multiple wirings are disposed in the vertical transfer direction are connected to the first readout system 32A and the second readout system 32B alternately.

Also, the second readout wirings 31B are connected to a first readout system 33A each wiring in the vertical transfer direction, and the remaining second readout wirings 31B are connected to a second readout system 33B each wiring in the vertical transfer direction. That is to say, the second readout wirings 31B of which the multiple wirings are disposed in the vertical transfer direction are connected to the first readout system 33A and the second readout system 33B alternately.

With the solid-state imaging device having the above wiring configuration, the first readout system 32A, the second readout system 33A, the first readout system 32B, and the second readout system 33B are driven in order, thereby realizing four-phase driving (four field readout).

The solid-state imaging device described with reference to FIG. 14 may be used as the solid-state imaging device having the above configuration.

With the solid-state imaging device having the above configuration, readout of the first readout wirings 31A, and readout of the second readout wirings 31B are executed alternately, whereby all the pixels can be readout by two steps.

26. Fifth Embodiment

Twelfth Example of Readout Method for Solid-State Imaging Device

The fifth embodiment of the present invention (twelfth example of the readout method for the solid-state imaging device) will be described with the plan layout view of FIG. 26. Note that arrows in the drawing represent "readout" of signal charge from a photo sensor 13 to a vertical CCD shift register.

As shown in FIG. 26, with a semiconductor substrate 11, multiple pixels 12 are arrayed in the vertical transfer direction and in the horizontal transfer direction. Also, with the semiconductor substrate 11, a vertical CCD shift register 21 is formed between two pixels 12 (12A, 12B) adjacent in the horizontal transfer direction of the multiple pixels 12. That is to say, the above two pixels adjacent in the horizontal transfer direction, for example, the pixels 12 (12A and 12B) share the vertical CCD shift register 21.

Also, a first channel stop portion 14 for separation between pixels is formed between the above two pixels 12 (12A and 12B), and pixels 12 (12C) adjacent thereto in the horizontal transfer direction. Accordingly, the first channel stop portions 14 are disposed between the above two pixels 12 (12A and 12B), and other two pixels 12 (12A and 12B) adjacent thereto.

A readout wiring 31 to be connected to a readout electrode (not shown) formed in the photo sensor 13 of each of the above pixels 12 is disposed between the pixel rows of the pixels 12A adjacent in the vertical transfer direction, and between the pixel rows of the pixels 12B arrayed in the same horizontal transfer direction as the pixel rows of the pixels 12A.

The readout wirings 31 are made up of first readout wirings 31A and second readout wirings 31B, alternately disposed each wiring between the pixels in the vertical transfer direction.

The first readout wirings 31A are connected alternately to the readout electrode (not shown) formed at the pixels 12 (12A and 12B) across the first readout wirings 31A in the vertical transfer direction.

The second readout wirings 31B are connected to the readout electrode (not shown) formed at pixels not connected to the first readout wirings 31A, of the pixels 12 (12A and 12B) across the second readout wirings 31B in the vertical transfer direction.

With the present example, the first readout wirings 31A and the second readout wirings 31B are connected alternately every two pixels in the horizontal transfer direction.

In the order in which the first readout wirings 31A are disposed in the vertical transfer direction, the first readout wirings 31A are connected to the first readout system 32A, first readout system 32B, and first readout system 32C sequentially, and connection thereof is repeated.

Also, in the order in which the second readout wirings 31B are disposed in the vertical transfer direction, the second readout wirings 31B are connected to the second readout system 33A, second readout system 33B, and second readout system 33C sequentially, and connection thereof is repeated.

With the solid-state imaging device having the above wiring configuration, the first readout system 32A, the second readout system 33A, the first readout system 32B, the second readout system 33B, the first readout system 32C, and the second readout system 33C, are driven in order, thereby realizing six-phase driving (six field readout).

The solid-state imaging device described with reference to FIG. 14 may be used as the solid-state imaging device having the above configuration.

With the solid-state imaging device having the above configuration, readout of the first readout wirings 31A, and readout of the second readout wirings 31B are executed alternately, whereby all the pixels can be readout by two steps.

With the readout method for each of the above solid-state imaging devices, the readout electrodes of all the pixels 12 are connected to the first readout wiring 31A and the second readout wiring 31B, and accordingly, readout of the first readout wiring 31A and readout of the second readout wiring 31B can be executed alternately. Thus, readout voltage is not applied between the pixels 12 in the vertical transfer direction, and accordingly, occurrence of color mixture between pixels can be suppressed. Also, there is provided an advantage wherein all the pixels 12 can be read out by two steps.

Also, the sequence of readout electrodes is set to two pixels with a two-pixel interval, whereby horizontal ½ thinning can be handled.

27. Application Examples of First Through Fifth Embodiments

Example Applied to Imaging Device

Next, an example of the application examples of the above solid-state imaging devices 1 through 3 will be described with reference to the block diagram in FIG. 27. Examples of this imaging device include cameras such as video cameras, digital still cameras, and cellular phones.

As shown in FIG. 27, with an imaging apparatus 200, an imaging unit 201 includes a solid-state imaging device (not shown). An imaging optical unit 202 which forms an image is provided on the condensing side of the imaging unit 201, and the imaging unit 201 is connected to a signal processing unit 203 including a driving circuit which drives the imaging optical unit 202, a signal processing circuit which subjects a signal converted in a photoelectric manner at the solid-state imaging device to an image process, and so forth. Also, the image signal processed by the signal processing unit may be stored by an image storage unit (not shown). With such an imaging apparatus 200, the solid-state imaging devices 1 through 3 described in the first embodiment may be used as the above solid-state imaging device.

With the imaging apparatus 200, the solid-state imaging devices 1 through 3 according to the embodiments of the present invention are used, meaning that solid-state imaging devices which can suppress occurrence of color mixture between pixels are used, which provides an advantage in that high-definition video can be recorded.

Note that the imaging apparatus 200 is not restricted to the above configuration, and may be applied to an imaging apparatus having any configuration as long as this imaging apparatus is an imaging apparatus using a solid-state imaging device.

The above solid-state imaging devices 1 through 3 may be formed as a one-chip device, or may be formed as a module mode having an imaging function, in which an imaging unit and a signal processing unit and/or an optical system are packaged integrally.

Also, an embodiment of the present invention may be applied to not only a solid-state imaging device but also an imaging apparatus. In this case, an effect of high image quality is obtained with the imaging apparatus. Here, the term "imaging apparatus" refers to, for example, a camera or portable device having an imaging function. Also, the term "imaging" includes not only taking an image at the time of normal camera shooting but also fingerprint detection or the like as a broad sense of the term.

The present application contains subject matter related to that disclosed in Japanese Priority Patent Application JP 2008-295194 filed in the Japan Patent Office on Nov. 19, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a plurality of pixels arrayed in a vertical transfer direction and in a horizontal transfer direction;
   a vertical CCD shift register disposed between two pixels adjacent in the horizontal transfer direction of said plurality of pixels;
   a first channel stop portion used for separation between pixels, formed between said two pixels and other pixels adjacent to said two pixels in the horizontal transfer direction; and
   a readout gate portion and a second channel stop portion, formed in a direction parallel to the vertical transfer direction between said pixels and said vertical CCD shift register;
   wherein said two pixels adjacent in the horizontal transfer direction share said vertical CCD shift register;
   and wherein an insulating layer which is thicker than a gate insulating layer of said vertical CCD shift register is formed above said first channel stop portion.

2. The solid-state imaging device according to claim 1, wherein said readout gate portion in said vertical transfer direction is formed longer than said second channel stop portion in said vertical transfer direction;
   and wherein the transfer electrode of said vertical CCD shift register is formed protruding above said readout gate portion via said readout gate insulating layer, and said transfer electrode also serves as said readout electrode.

3. A solid-state imaging device comprising:
   a plurality of pixels arrayed in a vertical transfer direction and in a horizontal transfer direction;
   a vertical CCD shift register disposed between two pixels adjacent in the horizontal transfer direction of said plurality of pixels;
   a first channel stop portion used for separation between pixels, formed between said two pixels and other pixels adjacent to said two pixels in the horizontal transfer direction; and
   a readout gate portion and a second channel stop portion, formed in a direction parallel to the vertical transfer direction between said pixels and said vertical CCD shift register;
   wherein said two pixels adjacent in the horizontal transfer direction share said vertical CCD shift register;
   and wherein the transfer electrode of said vertical CCD shift register is a transfer electrode having a 3-electrode structure per pixel;
   and wherein a portion of said one transfer electrode having a 3-electrode structure is formed above said readout gate portion in said vertical transfer direction via a readout gate insulating layer.

4. The solid-state imaging device according to claim 3, wherein said readout gate portion in said vertical transfer direction is formed longer than said second channel stop portion in said vertical transfer direction;
   and wherein the transfer electrode of said vertical CCD shift register is formed protruding above said readout gate portion via said readout gate insulating layer, and said transfer electrode also serves as said readout electrode.

5. A solid-state imaging device comprising:
   a plurality of pixels arrayed in a vertical transfer direction and in a horizontal transfer direction;

a vertical CCD shift register disposed between two pixels adjacent in the horizontal transfer direction of said plurality of pixels;

a first channel stop portion used for separation between pixels, formed between said two pixels and pixels adjacent to said two pixels adjacent in the horizontal transfer direction; and a readout gate portion and a second channel stop portion, formed in a direction parallel to the vertical transfer direction between said pixels and said vertical CCD shift register;

wherein said two pixels adjacent in the horizontal transfer direction share said vertical CCD shift register;

and wherein a readout electrode is formed above said readout gate portion independently of the transfer electrode of said vertical CCD shift register via a readout gate insulating layer.

6. The solid-state imaging device according to claim 5, wherein said readout electrode is formed lateral to the transfer electrode of said vertical CCD shift register.

7. The solid-state imaging device according to claim 5, wherein said transfer electrode is formed covering the upper side of said second channel stop portion formed lateral to said vertical CCD shift register;

and wherein said readout electrode is formed via an insulating layer above the transfer electrode of said vertical CCD shift register, and is extended and formed above said readout gate portion via said gate insulating layer.

8. A readout method for a solid-state imaging device, said solid-state imaging device including a plurality of pixels arrayed in a vertical transfer direction and in a horizontal transfer direction, a vertical CCD shift register disposed between two pixels adjacent in the horizontal transfer direction of said plurality of pixels, and a first channel stop portion used for separation between pixels, formed between said two pixels and pixels adjacent to said two pixels in the horizontal transfer direction, said method comprising the steps of:

sharing said vertical CCD shift register by said two pixels disposed in the horizontal transfer direction;

providing a readout wiring, disposed between said pixels in the vertical transfer direction, which connects to the readout electrode formed in said each pixel;

making up said readout wiring with two wirings of a first readout wiring and a second readout wiring, disposed between pixels in the vertical transfer direction;

connecting said first readout wiring and said second readout wiring alternately as to the readout electrode formed in each pixel arrayed in the horizontal transfer direction between said first readout wiring and said second readout wiring; and reading out all the pixels in only two transfer steps by executing readout of said first readout wiring, and readout of said second readout wiring alternately.

9. The readout method for the solid-state imaging device according to claim 8, wherein said first readout wiring and said second readout wiring are connected alternately every pixel in the horizontal transfer direction.

10. The readout method for the solid-state imaging device according to claim 8, wherein said first readout wiring and said second readout wiring are connected alternately every two pixels in the horizontal transfer direction.

11. A readout method for a solid-state imaging device, said solid-state imaging device including a plurality of pixels arrayed in a vertical transfer direction and in a horizontal transfer direction, a vertical CCD shift register disposed between two pixels adjacent in the horizontal transfer direction of said plurality of pixels, and a first channel stop portion used for separation between pixels, formed between said two pixels and pixels adjacent to said two pixels in the horizontal transfer direction, said method comprising the steps of:

sharing said vertical CCD shift register by said two pixels disposed in the horizontal transfer direction;

disposing a first readout wiring and a second readout wiring alternately one wiring at a time between pixels in the vertical transfer direction;

connecting said first readout wiring alternately to the readout electrodes formed in pixels across said first readout wiring in the vertical direction;

connecting said second readout wiring to the readout electrodes formed in pixels to which said first readout wiring is not connected, of pixels across said second readout wiring in the vertical direction; and reading out all the pixels in only two transfer steps by executing readout of said first readout wiring, and readout of said second readout wiring alternately.

12. The readout method for the solid-state imaging device according to claim 11, wherein said first readout wiring and said second readout wiring are connected alternately every pixel in the horizontal transfer direction.

13. The readout method for the solid-state imaging device according to claim 11, wherein said first readout wiring and said second readout wiring are connected alternately every two pixels in the horizontal transfer direction.

* * * * *